United States Patent
Jiang et al.

(10) Patent No.: US 10,634,333 B2
(45) Date of Patent: Apr. 28, 2020

(54) LED LAMP HAVING PASSIVE HEAT DISSIPATING ELEMENT AND TWO HEAT DISSIPATING CHANNEL

(71) Applicant: JIAXING SUPER LIGHTING ELECTRIC APPLIANCE CO., LTD, Jiaxing (CN)

(72) Inventors: Tao Jiang, Jiaxing (CN); Mingbin Wang, Jiaxing (CN); Aiming Xiong, Jiaxing (CN); Lin Zhou, Jiaxing (CN)

( * ) Notice: Subject to any disclaimer, the term of this patent is extended or adjusted under 35 U.S.C. 154(b) by 0 days.

(21) Appl. No.: 16/404,768

(22) Filed: May 7, 2019

(65) Prior Publication Data

US 2019/0264904 A1    Aug. 29, 2019

Related U.S. Application Data

(63) Continuation of application No. 16/267,747, filed on Feb. 5, 2019.

(30) Foreign Application Priority Data

Feb. 8, 2018  (CN) .......................... 2018 1 0130085
May 18, 2018 (CN) .......................... 2018 1 0479044

(Continued)

(51) Int. Cl.
*F21V 29/00*    (2015.01)
*F21V 29/503*   (2015.01)

(Continued)

(52) U.S. Cl.
CPC ............ *F21V 29/503* (2015.01); *F21K 9/235* (2016.08); *F21K 9/237* (2016.08); *F21K 9/238* (2016.08);

(Continued)

(58) Field of Classification Search
CPC ...... F21V 29/503; F21V 29/83; F21V 29/773; H05B 45/395; H05B 45/50; H05B 45/37;

(Continued)

(56) References Cited

U.S. PATENT DOCUMENTS

| 7,748,870 B2 | 7/2010 | Chang et al. |
| 8,985,815 B2 * | 3/2015 | Chen .................... F21V 23/023 362/294 |

(Continued)

FOREIGN PATENT DOCUMENTS

| CN | 201606689 U | 10/2010 |
| CN | 201651880 U | 11/2010 |

(Continued)

*Primary Examiner* — Ali Alavi
(74) *Attorney, Agent, or Firm* — Simon Kuang Lu

(57) ABSTRACT

An LED (light emitting diode) lamp comprising: a lamp shell; a passive heat dissipating element having a heat sink connected to the lamp shell, wherein the heat sink comprises fins and a base; a power source disposed in the lamp shell; a light emitting element connected to the base of the heat sink of the passive heat dissipating element and comprising LED chips electrically connected to the power source; a first channel defined in a chamber of the lamp shell for dissipating heat generated from the power source while the LED lamp is working; and a second channel defined in the heat sink and between the fins and the base for dissipating the heat of the heat sink, which is generated from the LED chips and transferred to the heat sink; wherein the first channel comprises a first end on the light emitting element to allow air flowing from outside of the LED lamp into the chamber, and a second end on the upper portion of the lamp shell to allow air flowing from inside of the chamber out to the LED lamp; wherein the second channel comprises a third end on the light emitting element to allow air flowing from outside of the LED lamp into the second channel, and flowing out from spaces between every adjacent two of the fins; wherein (Continued)

the light emitting element further comprises an aperture communicating simultaneously with both the first channel and the second channel by connecting with the first end of the first channel and the third end of the second channel.

20 Claims, 20 Drawing Sheets

(30) Foreign Application Priority Data

| | | |
|---|---|---|
| May 28, 2018 | (CN) | 2018 1 0523952 |
| Jun. 6, 2018 | (CN) | 2018 1 0573322 |
| Jun. 20, 2018 | (CN) | 2018 1 0634571 |
| Jul. 12, 2018 | (CN) | 2018 1 0763089 |
| Jul. 12, 2018 | (CN) | 2018 1 0763800 |
| Aug. 24, 2018 | (CN) | 2018 1 0972904 |
| Oct. 9, 2018 | (CN) | 2018 1 1172470 |
| Nov. 1, 2018 | (CN) | 2018 1 1295618 |
| Nov. 2, 2018 | (CN) | 2018 1 1299410 |
| Nov. 13, 2018 | (CN) | 2018 1 1347198 |
| Nov. 19, 2018 | (CN) | 2018 1 1378174 |
| Dec. 3, 2018 | (CN) | 2018 1 1466198 |

(51) Int. Cl.

| | |
|---|---|
| *F21K 9/235* | (2016.01) |
| *F21V 29/77* | (2015.01) |
| *F21K 9/238* | (2016.01) |
| *F21K 9/237* | (2016.01) |
| *F21V 29/83* | (2015.01) |
| *F21K 9/66* | (2016.01) |
| *F21K 9/68* | (2016.01) |
| *H05B 45/50* | (2020.01) |
| *H05B 45/395* | (2020.01) |
| *F21V 7/00* | (2006.01) |
| *H03H 11/04* | (2006.01) |
| *F21Y 115/10* | (2016.01) |
| *F21Y 105/18* | (2016.01) |
| *H03H 7/01* | (2006.01) |

(52) U.S. Cl.
CPC ............ *F21K 9/66* (2016.08); *F21K 9/68* (2016.08); *F21V 7/0025* (2013.01); *F21V 29/773* (2015.01); *F21V 29/83* (2015.01); *H05B 45/395* (2020.01); *H05B 45/50* (2020.01); *F21Y 2105/18* (2016.08); *F21Y 2115/10* (2016.08); *H03H 7/0115* (2013.01); *H03H 11/04* (2013.01)

(58) Field of Classification Search
CPC ..... F21K 9/68; F21K 9/66; F21K 9/83; F21K 9/237; F21K 9/238; F21K 9/235; F21K 9/233; H03H 7/0115; F21Y 2105/18; F21Y 215/10
USPC ........................................................ 362/294
See application file for complete search history.

(56) References Cited

U.S. PATENT DOCUMENTS

| | | | |
|---|---|---|---|
| 9,897,304 | B2 | 2/2018 | Shum |
| 2007/0230188 | A1 | 10/2007 | Lin |
| 2009/0141500 | A1* | 6/2009 | Peng ................. F21K 9/233 |
| | | | 362/294 |
| 2012/0085516 | A1 | 4/2012 | McClellan |
| 2016/0025322 | A1 | 1/2016 | Chen et al. |

FOREIGN PATENT DOCUMENTS

| | | |
|---|---|---|
| CN | 102032491 A | 4/2011 |
| CN | 102374427 A | 3/2012 |
| CN | 102859256 A | 1/2013 |
| CN | 203190364 U | 9/2013 |
| CN | 203442750 U | 2/2014 |
| CN | 203656721 U | 6/2014 |
| CN | 204114712 U | 1/2015 |
| CN | 104728631 A | 6/2015 |
| CN | 204717489 U | 10/2015 |
| CN | 204785745 U | 11/2015 |
| CN | 107345628 A | 11/2017 |
| CN | 108368977 A | 8/2018 |
| KR | 100932192 B1 | 12/2009 |

* cited by examiner

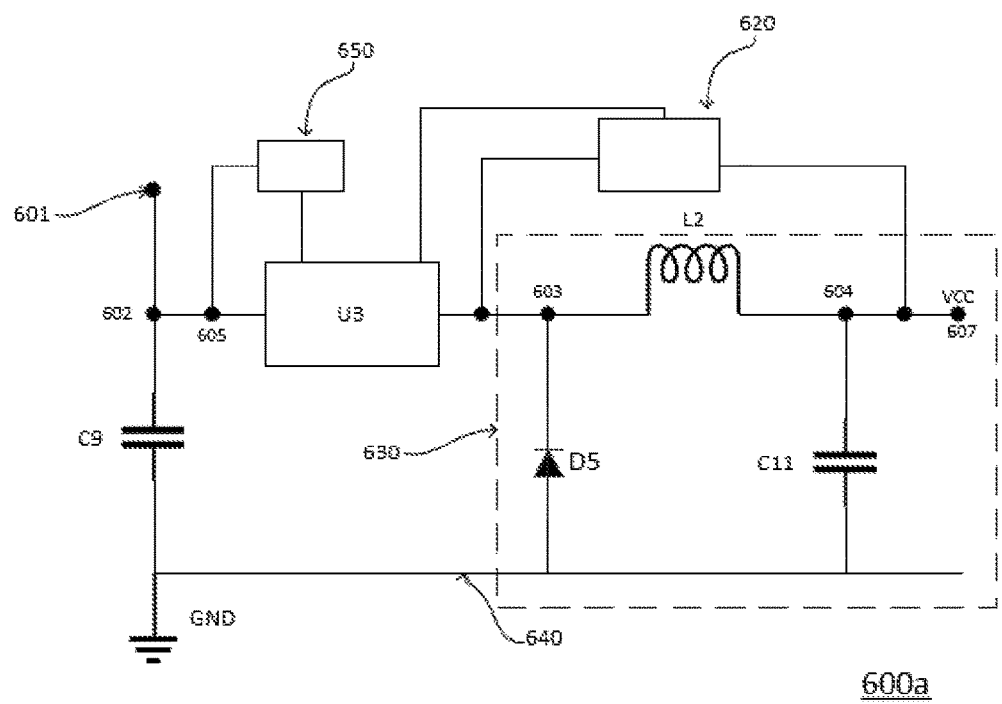
FIG. 25
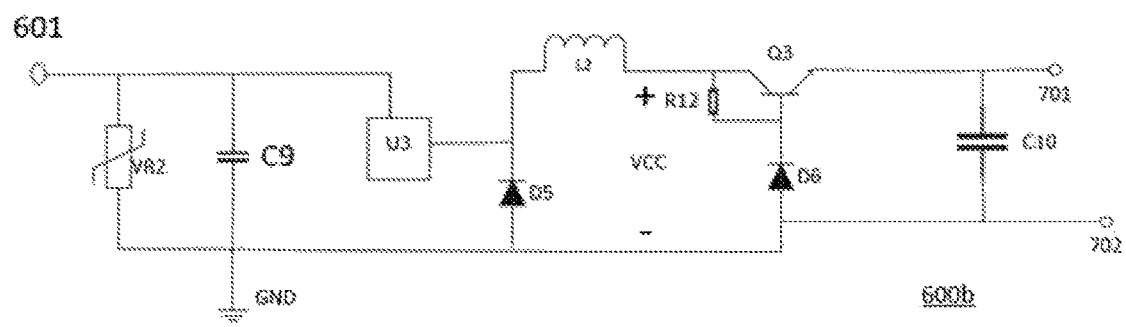
FIG. 26
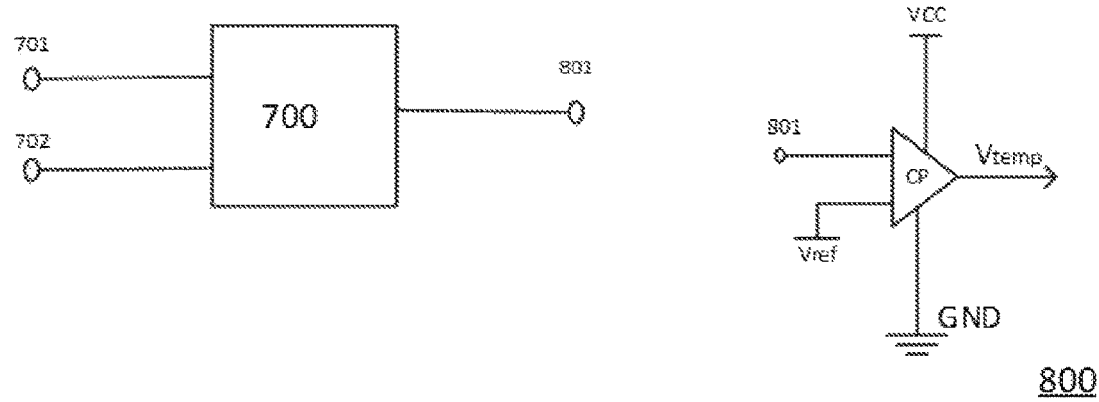
FIG. 27
FIG. 28

LED LAMP HAVING PASSIVE HEAT DISSIPATING ELEMENT AND TWO HEAT DISSIPATING CHANNEL

CROSS-REFERENCE TO RELATED APPLICATIONS

This application is a continuation application of U.S. application Ser. No. 16/267,747 filed on 2019 Feb. 5, which claims priority to the following Chinese Patent Applications No. CN 201810130085.3 filed on 2018 Feb. 8, CN 201810479044.5 filed on 2018 May 18, CN 201810523952.X filed on 2018 May 28, CN 201810573322.3 filed on 2018 Jun. 6, CN 201810634571.9 filed on 2018 Jun. 20, CN 201810763800.7 field on 2018 Jul. 12, CN 201810763089.5 filed on 2018 Jul. 12, CN 201810972904.9 filed on 2018 Aug. 24, CN 201811172470.0 filed on 2018 Oct. 9, CN 201811295618.X filed on 2018 Nov. 1, CN 201811299410.5 filed on 2018 Nov. 2, CN 201811347198.5 filed on 2018 Nov. 13, CN 201811378174.6 filed on 2018 Nov. 19, and CN 201811466198.7 filed on 2018 Dec. 3, the disclosures of which are incorporated herein in their entirety by reference.

FIELD OF THE INVENTION

The invention relates to lighting, particularly to LED lamps with passive heat dissipating element and two heat dissipating channel.

BACKGROUND OF THE INVENTION

Because LED lamps possess advantages of energy saving, high efficiency, environmental protection and long life, they have been widely adopted in the lighting field. LED lamps as an energy-saving green light source, a problem of heat dissipation of high-power LED lamps becomes more and more important. Overheating will result in attenuation of lighting efficiency. If waste heat from working high-power LED lamps cannot be effectively dissipated, then life of LED lamps will be directly fatally affected. As a result, in recent years, solution of the problem of heat dissipation of high-power LED lamps is an important issue for the industry.

OBJECT AND SUMMARY OF THE INVENTION

An object of the invention is to provide an LED lamp which is capable of solving the abovementioned problems.

The LED lamp provided by the invention includes an LED (light emitting diode) lamp comprising: a lamp shell; a passive heat dissipating element having a heat sink connected to the lamp shell, wherein the heat sink comprises fins and a base; a power source disposed in the lamp shell; a light emitting element connected to the base of the heat sink of the passive heat dissipating element and comprising LED chips electrically connected to the power source; a first channel defined in a chamber of the lamp shell for dissipating heat generated from the power source while the LED lamp is working; and a second channel defined in the heat sink and between the fins and the base for dissipating the heat of the heat sink, which is generated from the LED chips and transferred to the heat sink; wherein the first channel comprises a first end on the light emitting element to allow air flowing from outside of the LED lamp into the chamber, and a second end on the upper portion of the lamp shell to allow air flowing from inside of the chamber out to the LED lamp; wherein the second channel comprises a third end on the light emitting element to allow air flowing from outside of the LED lamp into the second channel, and flowing out from spaces between every adjacent two of the fins; wherein the light emitting element further comprises an aperture communicating simultaneously with both the first channel and the second channel by connecting with the first end of the first channel and the third end of the second channel.

Preferably, the aperture is located in a central region of the light emitting element, and the aperture forms an air intake of both the first channel and the second channel.

Preferably, the light emitting element comprises a first surface and a second surface which is opposite to the first surface, the LED chips are mounted on the first surface and surrounding the aperture, and the second surface is in contact with the base of the heat sink, such that heat generated from the LED chips is able to be transferred to the fins through the base while the LED lamp is working.

Preferably, the heat sink comprises first fins and second fins, bottoms of both the first fins and the second fins in an axis of the LED lamp connect to the base, the first fins interlace with the second fins at regular intervals, and one of the second fins includes a third portion and two fourth portions, the two fourth portions are symmetrical about the third portion.

Preferably, the lamp shell including a lamp head, a lamp neck and a sleeve, the lamp head connects to the lamp neck which connects to the sleeve.

Preferably, the power source having a first portion and a second portion, the first portion of the power source is disposed in both the lamp neck and the lamp head of the lamp shell, and the second portion of the power source is disposed in the heat sink of the passive heat dissipating element.

Preferably, further comprising a lamp cover with a light output surface and an end surface, wherein the end surface is formed with a vent to let air flowing from outside of the LED lamp into both the first channel and the second channel through the vent.

Preferably, the first end is projected onto the end surface in an axis of the LED lamp to occupy an area on the end surface, which is defined as a first portion, another area on the end surface is defined as a second portion, and the vent in the first portion is greater than the vent in the second portion in area.

Preferably, a ratio of power of the LED lamp to heat dissipating area of the heat sink is 1:20~30.

Preferably, the ratio of power of the LED lamp to heat dissipating area of the heat sink is 1:22~26.

Preferably, the ratio of power of the LED lamp to heat dissipating area of the heat sink is 1:25.

Preferably, a volume of the heat sink accounts for 20%~60% of an overall volume of the LED lamp.

Preferably, the volume of the heat sink accounts for 25%~50% of an overall volume of the LED lamp.

Preferably, overall weight of the LED lamp is less than 1.7 Kg, When the LED lamp is provided with power of 200 W, the LED chips are lit up and emit luminous flux of at least 25000 lumens.

Preferably, further comprising an inner reflecting surface disposed inside the light output surface of the lamp cover and an outer reflecting surface disposed in the outer circle of the array of the LED chips, wherein the inner reflecting surface is configured to reflect part of light emitted from the inmost of the array of LED chips, the outer reflecting surface is configured to reflect part of light emitted from the outermost of the array of LED chips.

Preferably, total luminous flux of the light reflected by both the inner reflecting surface and the outer reflecting surface and emitted through the light output surface is at least 1500 lm.

Preferably, the sleeve of the lamp shell is located in the heat sink, the lamp neck projects from the heat sink, height of the lamp neck is at least 80% of height of the heat sink.

Preferably, each of the first fins is divided into two portions in a radial direction of the LED lamp, the two portions are divided with a gap portion, the third portion is connected to the fourth portion through a transition portion, the transition portion has a buffer section and a guide section, a direction of any tangent of the guide section is separate from the gap portion.

Preferably, in the projected area of the LED lamp, there is a light concentrating area within the projected area, and luminous flux of the light projected by the LED lamp onto the light concentrated area accounts for 35%~50% of the total luminous flux.

Preferably, at least partially of fin has a protrusion projecting from a surface of the fin, the protrusions extend along an axis of the LED lamp and are in contact with the base.

BRIEF DESCRIPTION OF THE DRAWINGS

The following detailed descriptions, given by way of example, and not intended to limit the present invention solely thereto, will be best be understood in conjunction with the accompanying figures:

FIG. 25 is a circuit diagram of a bias generator of an embodiment of the invention;

FIG. 26 is a circuit diagram of a bias generator of another embodiment of the invention;

FIG. 27 is a circuit diagram of a temperature detector of an embodiment of the invention; and FIG. 28 is a circuit diagram of a temperature compensator of an embodiment of the invention.

DETAILED DESCRIPTION OF THE EMBODIMENTS

To make the present invention understandable and readable, the following disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just examples and many implementations and variations are possible without the details provided herein.

Figure 1:
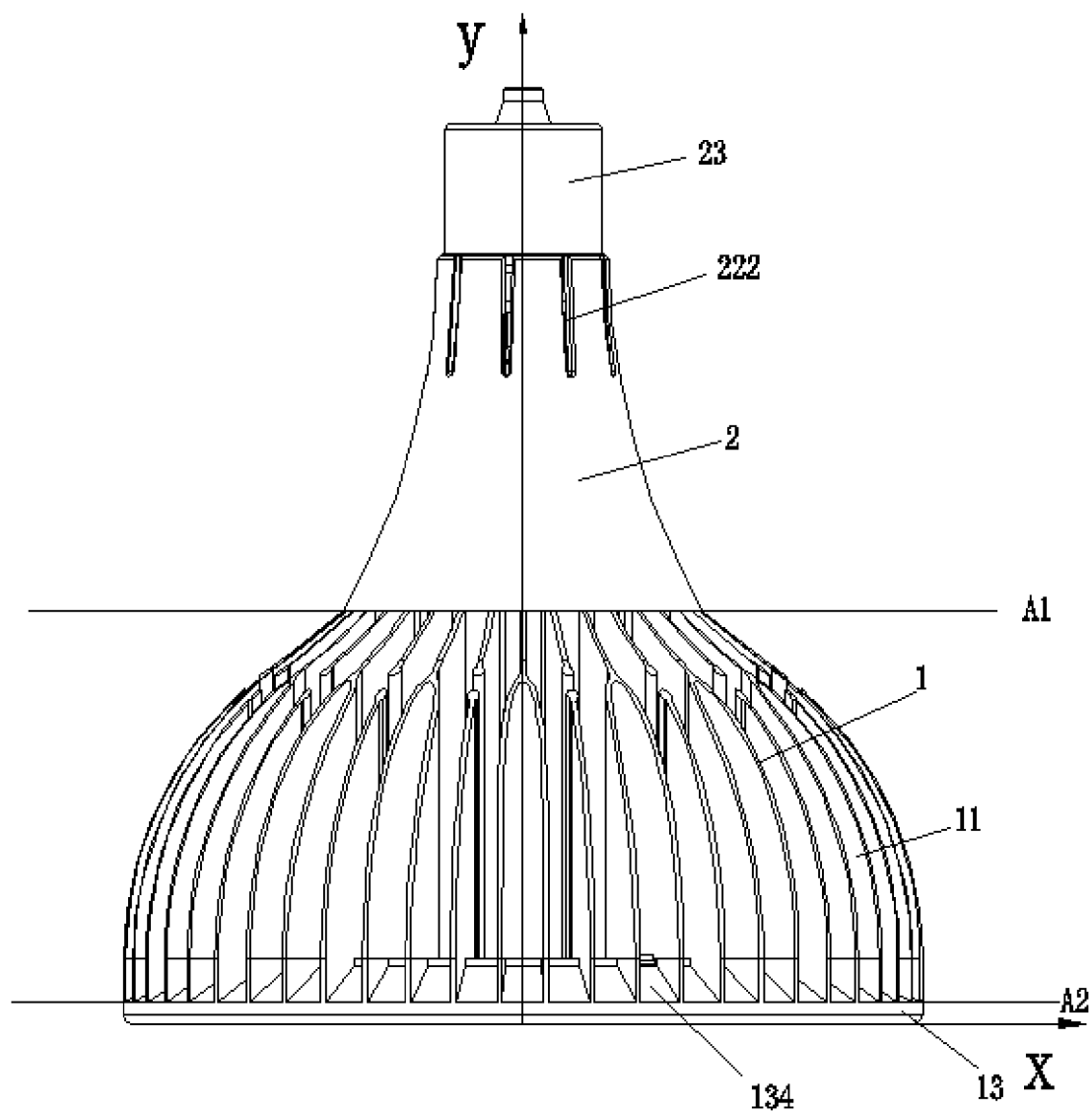
FIG. 1 is a structural schematic view of an embodiment of the LED lamp the invention.
Figure 2:
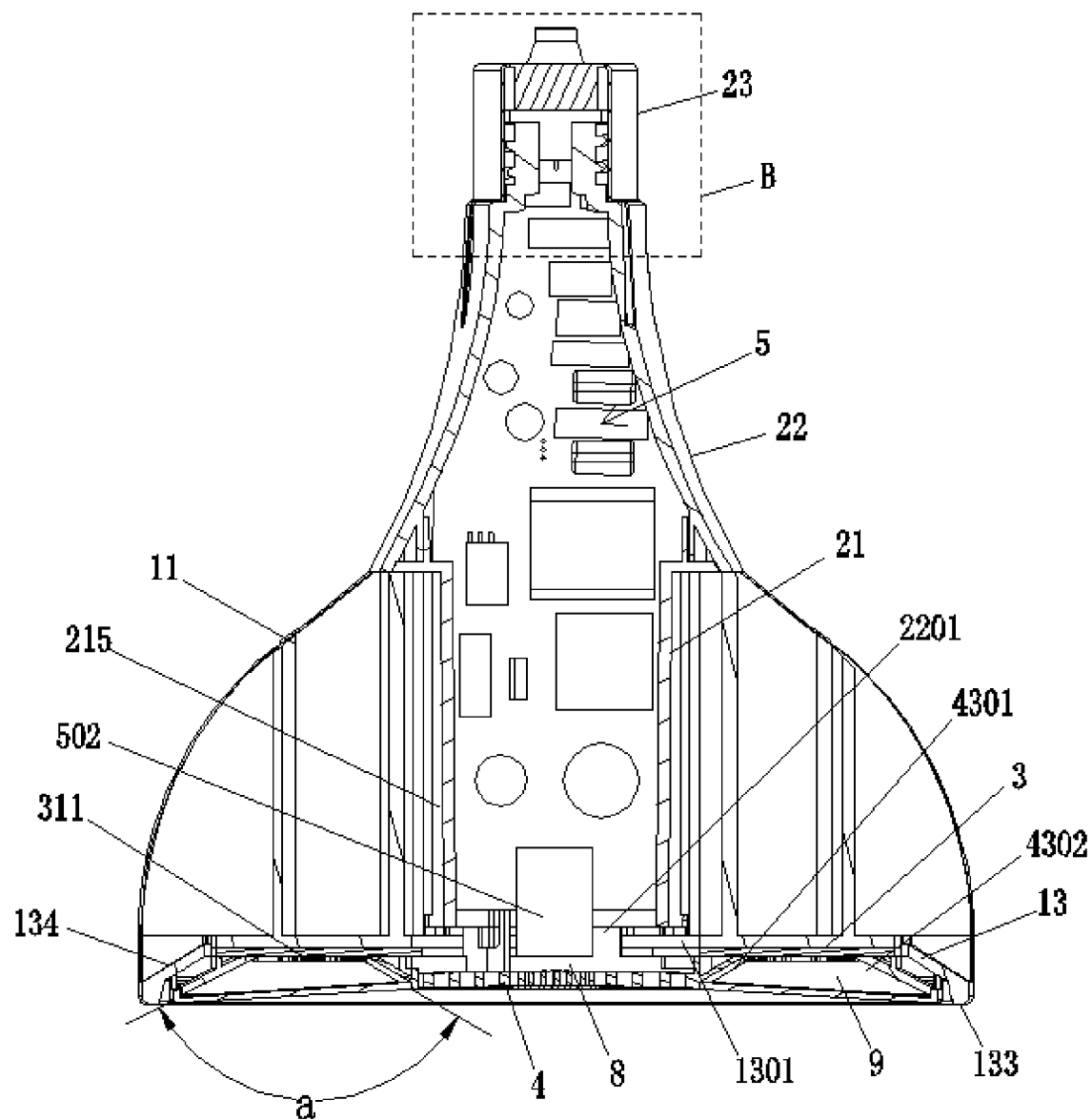
FIG. 2 is a schematic cross-sectional view of the LED lamp of FIG. 1.
Figure 3:
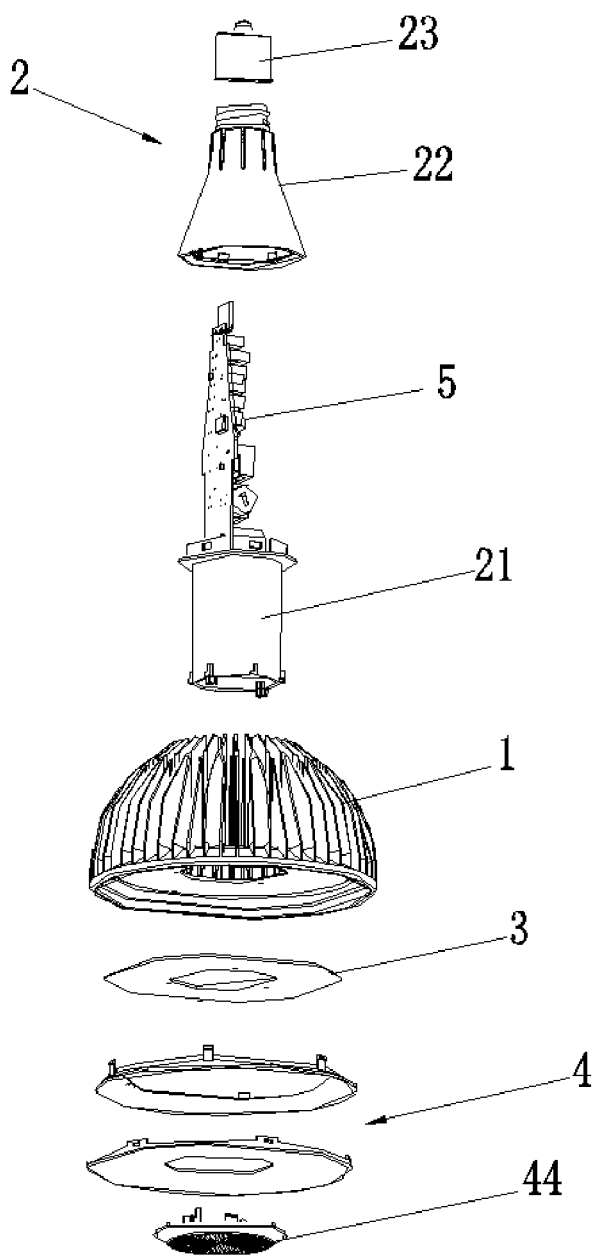
FIG. 3 is an exploded view of the LED lamp of FIG. 1.

FIG. 1 is a structural schematic view of an embodiment of the LED lamp the invention. FIG. 2 is a schematic cross-sectional view of the LED lamp of FIG. 1. FIG. 3 is an exploded view of the LED lamp of FIG. 1. As shown in the figures, the LED lamp includes a heat sink 1, a lamp shell 2, a light board 3, a lamp cover 4 and a power source 5. In this embodiment, the light board 3 is connected to the heat sink 1 by attachment for rapidly transferring heat from the light board 3 to the heat sink 1 when the LED lamp is working. Concretely, in some embodiments, the light board 3 is riveted to the heat sink 1. In some embodiments, the light board 3 is screwed to the heat sink 1. In some embodiments, the light board 3 is welded to the heat sink 1. In some embodiments, the light board 3 is adhered to the heat sink 1. In this embodiment, the lamp shell 2 is connected to the heat sink 1, the lamp cover 4 covers the light board 3 to make light emitted from the light board 3 pass through the lamp cover to project out. The power source 5 is located in a chamber of the lamp shell 2 and the power source 5 is EC to the LED chips 311 for providing electricity.

Figure 4:
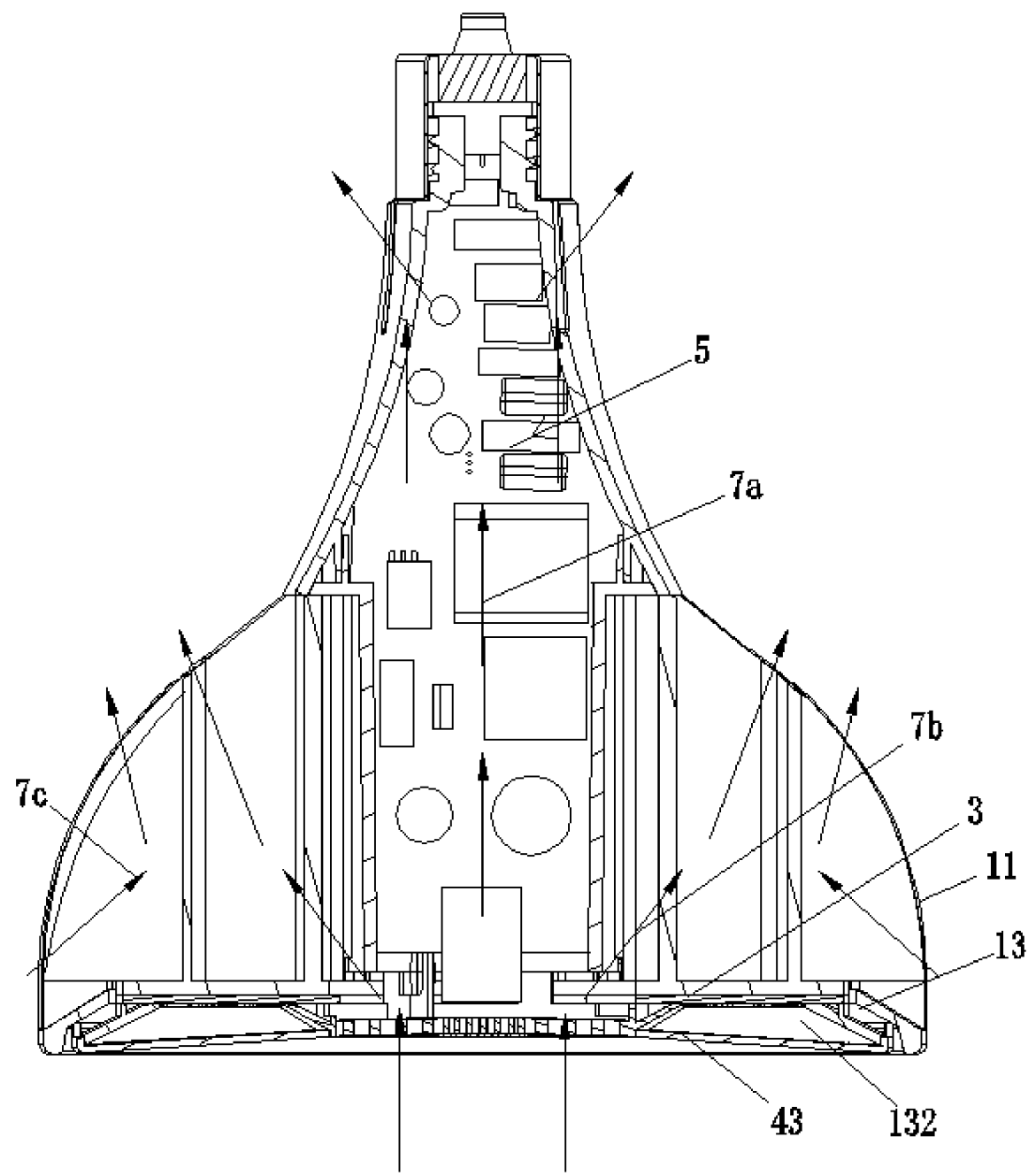
FIG. 4 is a schematic cross-sectional view of the LED lamp of FIG. 1, which shows the first heat dissipating channel and the second heat dissipating channel.

As shown in FIG. 4, which is a schematic cross-sectional view of the LED lamp. As shown in FIGS. 1, 2 and 4, the chamber of the lamp shell 2 of this embodiment is formed with a first heat dissipating channel 7a. An end of the first heat dissipating channel is formed with a first air inlet 2201. An opposite end of the lamp shell 2 is formed with a venting hole 222 (at an upper portion of the lamp neck 22). Air flow into the first heat dissipating channel 2201 and flow out from the venting hole 222 for bringing out heat in the first heat dissipating channel 7a (primarily, heat of the working power source 5). As for the path of heat dissipation, heat generated from the heat-generating components of the working power source 5 is transferred to air (around the heat-generating components) in the first heat dissipating channel 7a by thermal radiation first, and then external air enters the first heat dissipating channel 7a by convection to bring out internal air to make heat dissipation. In this embodiment, the venting hole 222 at the lamp neck 22 can also make direct heat dissipation.

As shown in FIGS. 1, 2 and 4, a second heat dissipating channel 7b is formed in the fins and the base 13 of the heat sink 1. The second heat dissipating channel 7b has a second air inlet 1301. In this embodiment, the first air inlet 2201 and the second air inlet 1301 share the same opening formed on the light board 3. This will be described more detail later. Air flows from outside of the LED lamp into the second air inlet 1301, passes through the second heat dissipating channel 7b and finally flows out from spaces between the fins 11 so as to bring out heat of the fins 11 to enhance heat dissipation of the fins 11. As for the path of heat dissipation, heat generated from the LED chips is conducted to the heat sink 1, the fins 11 of the heat sink 1 radiate the heat to surrounding air, and convection is performed in the second heat dissipating channel 7b to bring out heated air in the heat sink 1 to make heat dissipation.

As shown in FIGS. 1 and 4, the heat sink 1 is provided with a third heat dissipating channel 7c formed between adjacent two of the fins 11 or in a space between two sheets extending from a single fin 11. A radial outer portion between two fins 11 forms an intake of the third heat dissipating channel 7c. Air flows into the third heat dissipating channel 7c through the radial outer portion of the LED lamp to bring out heat radiated from the heat sink 11 to air.

Figure 5:
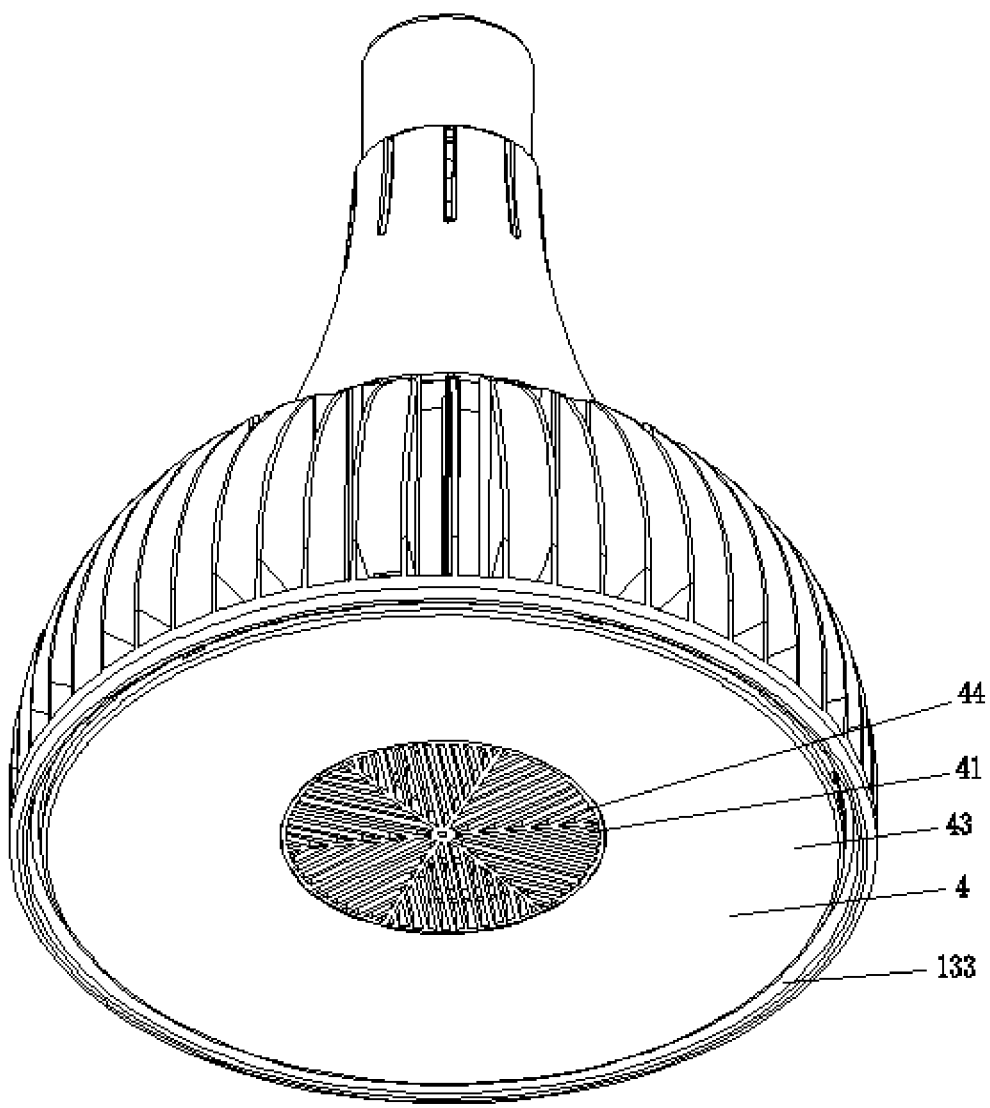
FIG. 5 is a perspective view of the LED lamp of FIG. 1.
Figure 6:
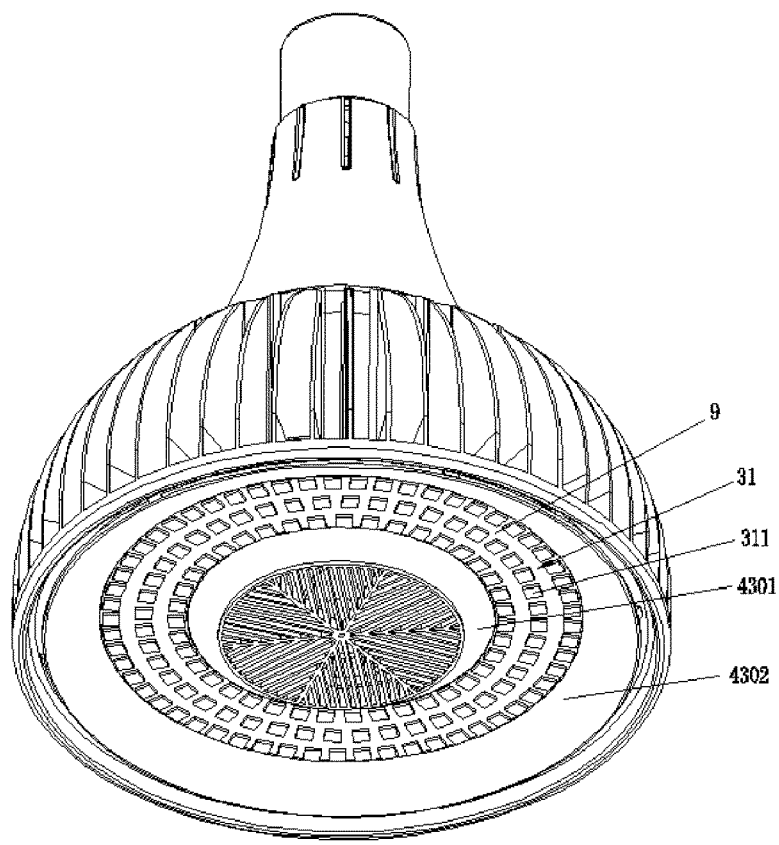
FIG. 6 is a structural schematic view of FIG. 5 without the light output surface.

FIG. 5 is a perspective view of the LED lamp of the embodiment, which shows assembling of the heat sink 1 and the lamp cover 4. FIG. 6 is a structural schematic view of FIG. 5 without the light output surface 43. As shown in FIGS. 5 and 6, in this embodiment, the lamp cover 4 includes a light output surface 43 and an end surface 44 with a vent 41. Air flows into both the first heat dissipating channel 7a and the second heat dissipating channel 7b through the vent 41. When the LED chips 311 (shown in FIG. 6) is illuminated, the light passes through the light output surface 43 to be projected from the lamp cover 4. In this embodiment, the light output surface 43 may use currently available light-permeable material such as glass, PC, etc. The term "LED chip" mentioned in all embodiments of the invention means all light sources with one or more LEDs (light emitting diodes) as a main part, and includes but not limited to an LED bead, an LED strip or an LED filament. Thus, the LED chip mentioned therein may be equivalent to an LED bead, an LED strip or an LED filament. As shown in FIG. 5, in this embodiment, the ratio of area of the light output surface 43 to area of the end surface 44 is 4~7. Preferably, the ratio of area of the light output surface 43 (area of a single side of the light output surface 43, i.e. area of surface of the side away from the LED chips 311) to area of the end surface 44 (area of a single side of the end surface 44, i.e. area of surface of the side away from the LED chips 311, including area of the vent 41) is 5~6. More preferably, the ratio of area of the light output surface 43 to area of the end surface 44 is 5.5. The end surface 44 is used for allowing air to pass to enter both the first heat dissipating channel 7a and the second heat dissipating channel 7b. The light output surface 43 allows light from the light source to output. As a result, a balance can be accomplished between the light output and the heat dissipation. In this embodiment, to satisfy the requirement of air intake of both the first heat dissipating channel 7a and the second heat dissipating channel 7b, the ratio of area of the lamp cover 4 to area of the end surface 44 is 6~7. As a result, a balance can be accomplished between the light output and air required by the heat dissipation.

Figure 7:
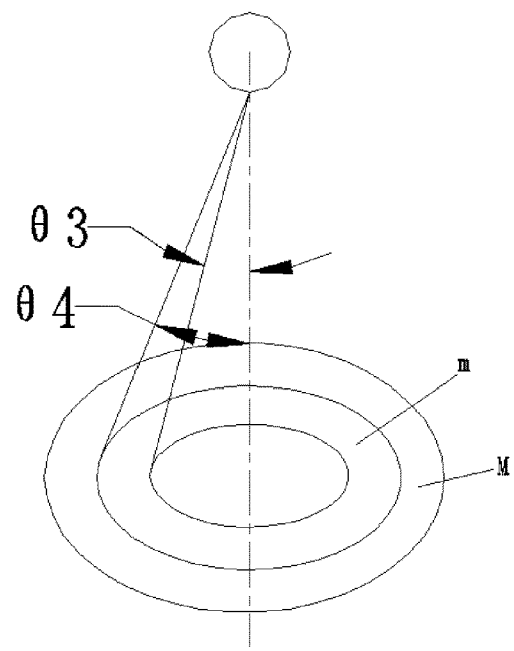
FIG. 7 is a schematic view of light projection of the LED lamp of FIG. 1.
Figure 8:
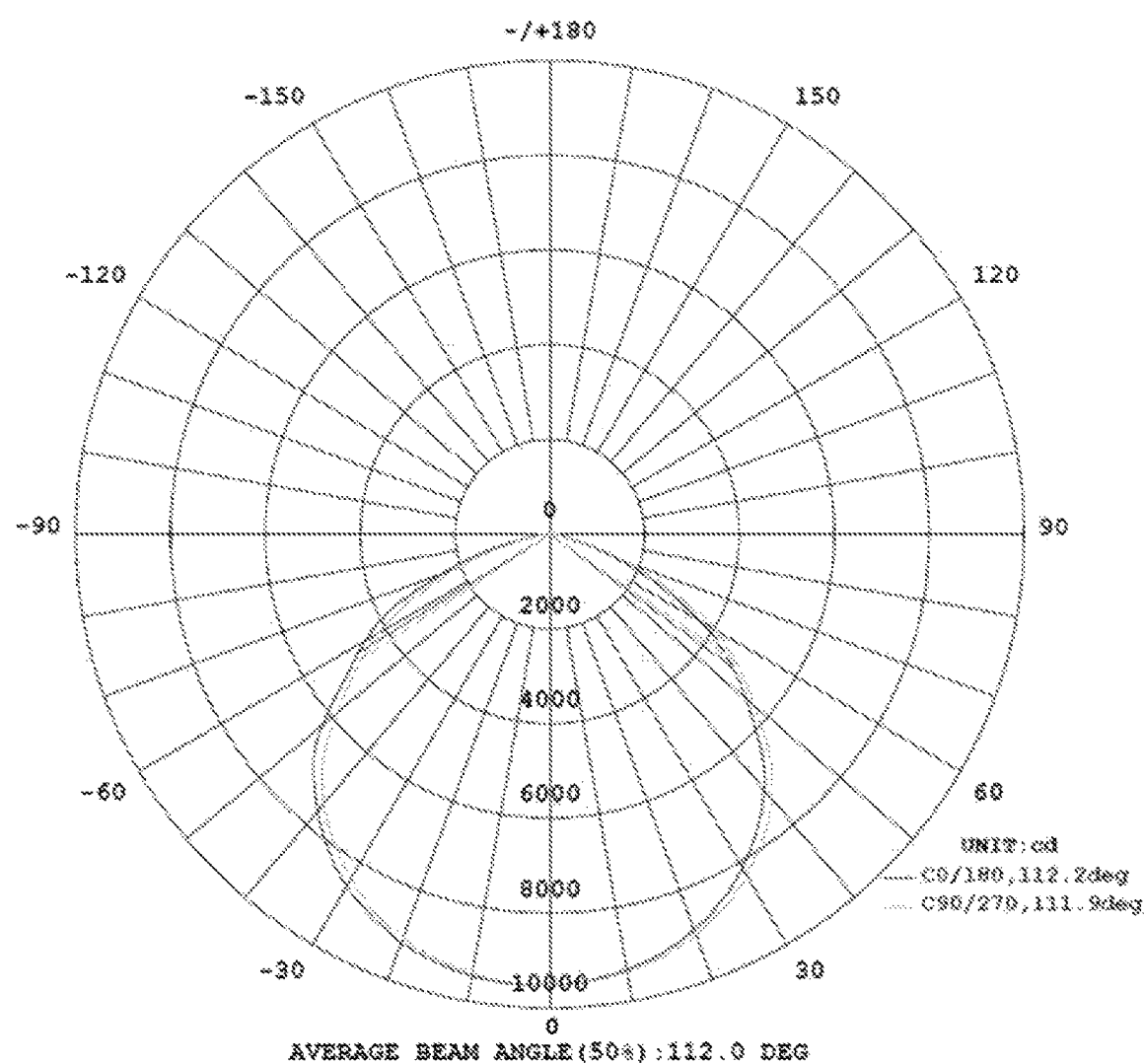
FIG. 8 is a light pattern of FIG. 7.

As shown in FIGS. 5 and 6, in this embodiment, an inner reflecting surface 4301 is disposed inside the light output surface 43 of the lamp cover 4. The inner reflecting surface 4301 is disposed in the inner circle of the array of LED chips 311. In an embodiment, an outer reflecting surface 4302 is disposed in the outer circle of the array of LED chips 311. The outer reflecting surface 4302 corresponds to the LED chips 311 on the light board 3. The arrangement of both the inner reflecting surface 4301 and the outer reflecting surface 4302 is used for adjusting a light emitting range of the LED chip set 31 to make the light concentrated and to increase brightness in a local area. In other words, under the condition of the same luminous flux, illuminance of the LED lamp can be increased. In the concrete, all the LED chips 311 in this embodiment are mounted on the bottom side of the light board 3 (in a using status). In other words, the LED lamp of the present embodiment do not emit lateral light from the LED chips 311. When working, the primary light emitting surface of the LED chips 311 are completely downward. At least 60% of the light from the LED chips 311 are emitted through the light output surface 43 without reflection. As a result, in comparison with those LED lamps with lateral light (the lateral light is reflected by a cover or a lampshade to be emitted downward, and in theory there must be part of light loss in the process of reflection.) The LED chips 311 in this embodiment possess better light emitting efficiency. In other words, under the condition of the same lumen value (luminous flux), the LED lamp in the present embodiment possesses higher illuminance. And the emitted light can be concentrated to increase illuminance in a local area by the arrangement of both the inner reflecting surface 4301 and the outer reflecting surface 4302, for example, in an area under the LED lamp between 120 degrees and 130 degrees (a light emitting range under the LED lamp between 120 degrees and 130 degrees). When the LED lamp is installed at a relatively high position, in the same angular range of light emitting, the lit area of the LED lamp still satisfies the requirement and illuminance in this area can be higher. FIG. 7 is a schematic view of light transmission of this embodiment and FIG. 8 is a light pattern of FIG. 7. As shown in FIGS. 5-8, in the aspect of the light emitting effect, in the projected area of the LED lamp, i.e. the projected area M under the LED lamp, there is a light concentrating area m within the projected area M, the LED lamp including the reflecting surface reflects at least part of light from the LED chips 311 onto the light concentrated area m to increase brightness of the light concentrated area m. The reflecting surface includes the inner reflecting surface 4301 and the outer reflecting surface 4302. Both the inner reflecting surface 4301 and the outer reflecting surface 4302 reflect at least part of light from the LED chips 311 onto the light concentrated area m. Preferably, in this embodiment, at least 5% of luminous flux of the light source is reflected to pass through the light output surface 43. In practice, total luminous flux of the light reflected by both the inner reflecting surface 4301 and the outer reflecting surface 4302 and emitted through the light output surface 43 is at least 1000 lm. Preferably, total luminous flux of the light reflected by both the inner reflecting surface 4301 and the outer reflecting surface 4302 and emitted through the light output surface 43 is at least 1500 lm. Total luminous flux of the light reflected by the outer reflecting surface 4302 is greater than that of the light reflected by the inner reflecting surface 4301. This shows that, about the problem of glare resulting from an LED lamp with high lumen, disposing the outer reflecting area 4302 can reflect considerable part of lateral luminous flux. This can significantly reduce the glare. In this embodiment, the light concentrated area m is an annular region. In this embodiment, a center angle between an inner edge of the light concentrated area m and an axis of the LED lamp is 20 degrees, and a center angle between an outer edge of the light concentrated area m and an axis of the LED lamp is 50 degrees. In this embodiment, luminous flux of the light projected by the LED lamp onto the light concentrated area m accounts for 35%~50% of the total luminous flux, so that the light concentrated area m possesses a better lighting effect. In addition, by the arrangement of both the inner reflecting surface 4301 and the outer reflecting surface 4302, not only can the lateral light be reduced to prevent glare, but also at least part of light from the LED chips 311 can be reflected onto the projected area M to enhance illuminance in the projected area M.

The inner reflecting surface 4301 is used for reflecting part of light emitted from the inmost LED chips 311 of the LED chip set 31. The outer reflecting surface 4302 is used for reflecting part of light emitted from the outermost LED chips of the LED chipset 31. The outermost LED chips 311 are greater than the inmost LED chips 311 in number. The outer reflecting surface 4302 is greater than the inner reflecting surface 4301 in area. Because the outermost portion of the LED chip set 31 includes more LED chips than the inmost portion, larger reflecting area is required to regulate light output.

In this embodiment, the inner reflecting surface 4301 and the outer reflecting surface 4302 have first area A1 and second area A2, respectively. The LED chips 311 in the outermost portion of the LED chip set 31 and in the inmost portion of the LED chip set 31 are N1 and N2 in number, respectively. Their relationship is:

(A1/N1):(A2/N2)=0.4~1

When the ratio of area of the inner reflecting surface 4301 corresponding to a single LED chip 311 in the inmost portion of the LED chip set 31 to area of the outer reflecting surface 4302 corresponding to a single LED chip 311 in the outermost portion of the LED chip set 31 falls in the above range, both the LED chips 311 in the inmost portion of the LED chip set 31 and the LED chips 311 in the outermost portion of the LED chip set 31 have a better effect of light output.

As shown in FIG. 2, in this embodiment, the inner reflecting surface 4301 is lower than the outer reflecting surface 4302 in height. The height means a height of each of the both in an axis of the LED lamp. By the configuration of the inner reflecting surface 4301 being lower than the outer reflecting surface 4302 in height, decrease of a light distribution under the LED lamp can be avoided and a central portion of the light distribution region of the LED lamp can be prevented to be a dark part. In this embodiment, height of the outer reflecting surface 4302 in the axis of the LED lamp is not greater than 20 mm. Preferably, height of the outer reflecting surface 4302 in the axis of the LED lamp is not greater than 15 mm. On the other hand, to control overall height of the LED lamp, height of the outer reflecting surface 4302 accounts for not over 9% of overall height of the LED lamp. Preferably, height of the outer reflecting surface 4302 accounts for not over 6% of overall height of the LED lamp. As for functions of the outer reflecting surface 4302, height of the outer reflecting surface 4302 has to account for above 2% of overall height of the LED lamp. Preferably, height of the outer reflecting surface 4302 accounts for above 3% of overall height of the LED lamp.

In other words, comprehensively considering control of height of the LED lamp and functions of reflection, light concentration, anti-glare, etc., it is necessary that height of the outer reflecting surface 4302 accounts for 2%~9% of overall height of the LED lamp. Preferably, height of the outer reflecting surface 4302 accounts for 3%~6% of overall height of the LED lamp.

Figure 9:
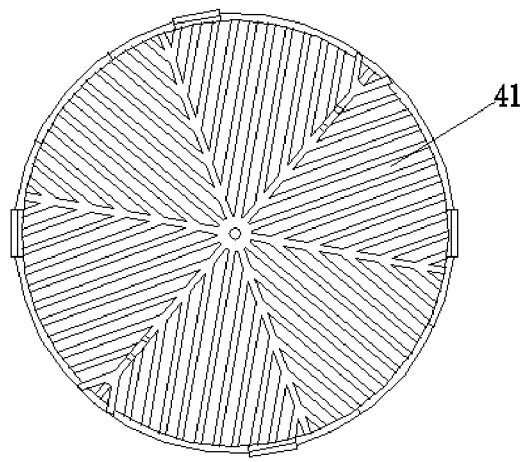
FIG. 9 is a schematic view of an end surface of the lamp cover of an embodiment.

As shown in FIG. 9, a diameter of a maximum inscribed circle of the vent 41 is less than 2 mm, preferably, 1.0~1.9.mm. As a result, both bugs and most dust can be resisted, and venting efficiency of the vent 41 can be kept great enough. In other words, alternatively, the vent 41 defines both a length direction and a width direction, i.e. the vent has a length and a width, and the length is greater than the width. The largest width of inscribed circle of the vent 41 is less than 2 mm. In an embodiment, the largest width is from 1 mm to 1.9 mm. In addition, the largest width of the vent 41 is greater than 1 mm. If the width of the vent 41 is less than 1 mm, then more pressure is required to push air to enter the vent 41, which is advanced for venting.

Figure 10A:
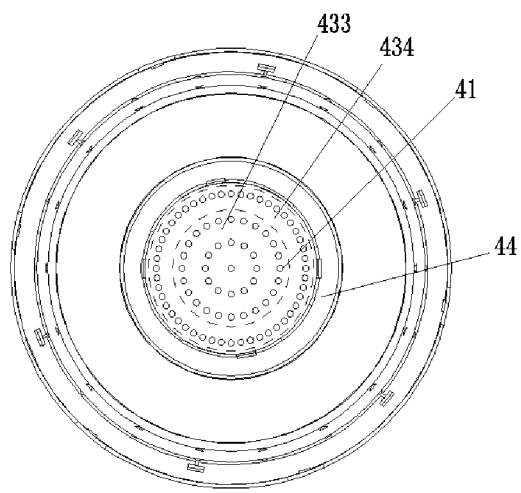
FIGS. 10A~10I are schematic views of some embodiments of the lamp cover.
Figure 10B:
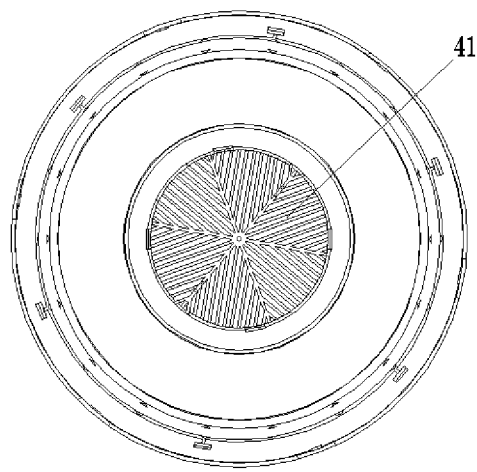
Figure 10C:
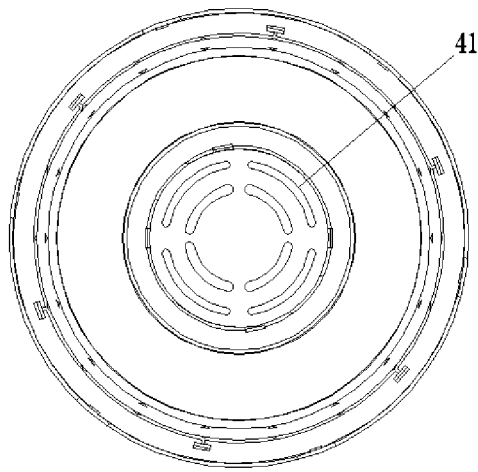
Figure 10D:
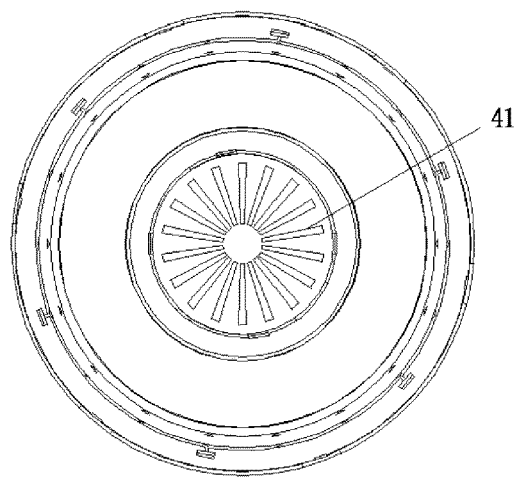
Figure 10E:
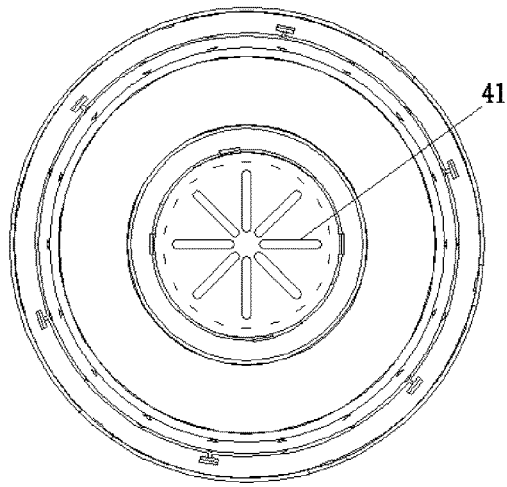
Figure 10F:
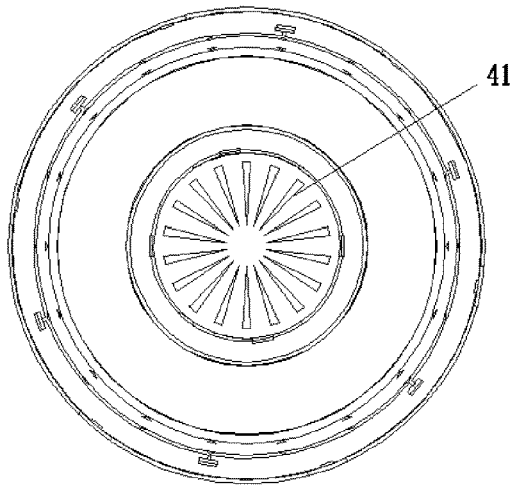
Figure 10G:
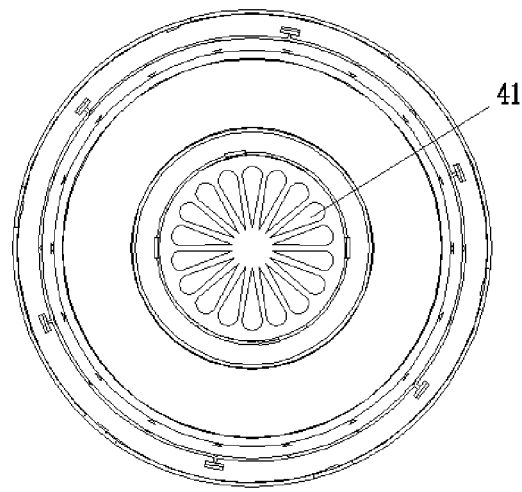

FIGS. 10A~10G show shapes of some embodiments of the vent 41. As shown in FIGS. 10A~10G, the vent 41 may be circular, strip-shaped, arced, trapezoidal, diamond or their combination. As shown in FIG. 10A, when the vent 41 is configured to be circular, its diameter must be less than 2 mm to resist bugs and most dust and venting efficiency of the vent 41 can be kept great enough. As shown in FIGS. 10B and 100, when the vent 41 is configured to be strip-shaped or arced, its width must be less than 2 mm to accomplish the above effects. As shown in FIG. 10D, when the vent 41 is configured to be trapezoidal, its lower base must be less than 2 mm to accomplish the above effects. As shown in FIG. 10E, when the vent 41 is configured to be roundcornered rectangular, its width must be less than 2 mm to accomplish the above effects. As shown in FIGS. 10F and 10G, when the vent 41 is configured to be triangular or drop-shaped, a diameter of its maximum inscribed circle must be less than 2 mm.

In some embodiments, the vent 41 on the end surface 44 is multiple in number. For example, the vents 41 may be annularly arranged on the end surface 44 for even air intake. The vents 41 may also be radially arranged on the end surface 44. The vents 41 may also be irregularly arranged.

Figure 10H:
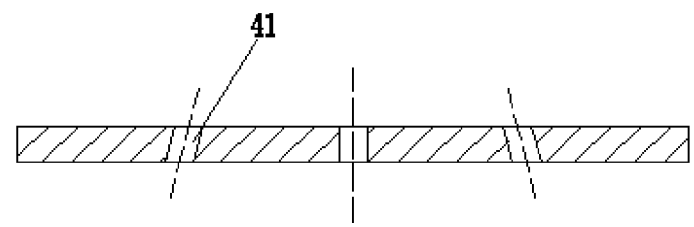
Figure 10I:
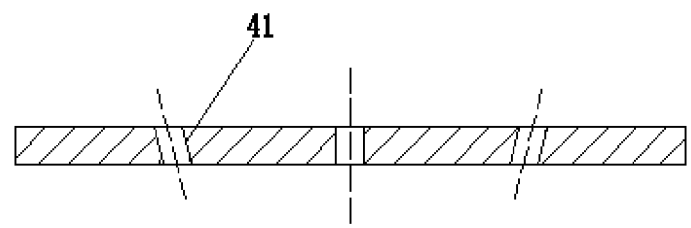

In some embodiments, in an axial direction of the LED lamp, the vents may be inclined to an axis of the LED lamp. In other words, an angle is formed between an axis of the vent 41 and the axis of the LED lamp. As shown in FIG. 10H, axes of at least part of the vents 41 are inclined to the axis of the LED lamp, and the inclined directions of the part of vents 41 are toward the first air inlet 2201 of the first heat dissipating channel 7a. Thus, after air passes the part of vents 41, it will flow to the first air inlet 2201 of the first heat dissipating channel 7a to perform convection for allowing more air to flow into the first heat dissipating channel 7a to dissipate heat from the power source 6 therein. As shown in FIG. 10I, axes of at least part of the vents 41 are inclined to the axis of the LED lamp, and the inclined directions of the part of vents 41 are toward the second air inlet 1301 of the second heat dissipating channel 7b. Thus, after air passes the part of vents 41, it will flow to the second air inlet 1301 of the second heat dissipating channel 7b to perform convection for allowing more air to flow into the second heat dissipating channel 7b to dissipate heat from the heat sink 1 therein.

In FIG. 10A, there are two broken lines on the end surface 44. The inner broken line represents a position the first air inlet 2201 (as shown in FIG. 2) is projected onto the end surface 44. The region within the inner broken line is defined as a first portion (first opening region 433). The region between the inner circle and the outer circle is defined as a second portion (second opening region 434). In this embodiment, the first air inlet 2201 is projected onto the end surface in an axis of the LED lamp to occupy an area on the end surface 44, it is the first portion (first opening region 433). The other area on the end surface 44 is the second portion (second opening region 434). The vent 41 in the first portion is greater than the vent 41 in the second portion in area. Such an arrangement is advantageous to making most air flow into the first heat dissipating channel 7a for better effect of heat dissipation to the power source 5 and reduction of rapidly aging of electronic components of the power source 5. These features are also available to the vent 41 in other embodiments.

In other embodiments, the first air inlet 2201 is projected onto the end surface 44 in an axis of the LED lamp to occupy an area on the end surface 44, it is the first portion (first opening region 433). The other area on the end surface 44 is the second portion (second opening region 434). The vent 41 in the first portion is greater than the vent 41 in the second portion in area. As a result, heat of the fins 11 can be better dissipated to perform better heat dissipation to the LED chips 311 and prevent a region around the LED chips 311 from forming high temperature. In detail, area of both the first portion and the second portion can be selected according to actual requirements.

In some applications, there may be a limit of overall weight of an LED lamp. For example, when an LED lamp adopts an E39 head, its maximum weight limit is 1.7 Kg. Thus, besides the fundamental elements such as a power source, a lamp cover and a lamp shell, in some embodiments, weight of a heat sink is limited within 1.2 Kg. For some high-power LED lamps, the power is about 150 W~300 W, and their luminous flux can reach 20000 lumens to 45000 lumens. That is, under a limit of weight, a heat sink must dissipate heat from an LED lamp with 20000~45000 lumens. Under a condition of heat dissipation of natural convection, usually power of 1 W needs area of heat dissipation of at least 35 square cm. The following embodiments intend to reduce area of heat dissipation for power of 1 W under guarantee of a receiving space of the power source 5 and effect of heat dissipation. Under a precondition of weight limit of the heat sink 1 and limit of the power source 5, the best effect of heat dissipation can be accomplished.

As shown in FIGS. 1 and 2, in this embodiment, the LED lamp includes passive heat dissipating elements which adopt natural convection and radiation as a heat dissipating manner without any active heat dissipating elements such as a fan. The passive heat dissipating element in this embodiment includes a heat sink 1 composed of fins 11 and a base 13. The fins 11 radially extend from and connect to the base 13. When using the LED lamp, at least part of heat from the LED chips 311 is conducted to the heat sink 1 by thermal conduction. At least part of heat occurred from the heat sink 1 is transferred to external air by thermal convection and radiation. A diameter of a radial outline of the heat sink 1, in a hanging status as shown in the figures, upward tapers off or is substantially in a taper shape for a better match with a lampshade.

As shown in FIGS. 2,4 and 5, a gap is kept between the end side 44 and the light board 3 to form a room 8. The room 8 communicates with both the first air inlet 2201 of the first heat dissipating channel 7a and the second air inlet 1301 of the second heat dissipating channel 7b. Air flows into the room 8 through the vent 41 of the end side 44 and then flows into both the first heat dissipating channel 7a and the second heat dissipating channel 7b. The room 8 allows air therein to mix and the mixed air is distributed according to negative pressure (resulting from temperature difference) of both the first and second heat dissipating channels 7a, 7b so as to make distribution of air more reasonable.

In this embodiment, when a passive heat dissipation manner (fanless) is adopted, the ratio of power (W) of the LED lamp to heat dissipating area (square cm) of the heat sink 1 is 1:20~30. That is, each watt needs heat dissipating area of 20~30 square cm for heat dissipation. Preferably, the ratio of power of the LED lamp to heat dissipating area of the heat sink 1 is 1:22~26. More preferably, the ratio of power of the LED lamp to heat dissipating area of the heat sink 1 is 1:25. The first heat dissipating channel 7a is formed in the lamp shell 2, the first heat dissipating channel 7a has the first air inlet 2201 at an end of the lamp shell 2, and another end of the lamp shell 2 has the venting hole 222. Air flows into the first air inlet 2201 and flows out from the venting hole 222 to bring out heat in the first heat dissipating channel 7a. The second heat dissipating channel 7b is formed in the fins 11 and the base 13 and the second heat dissipating channel 7b has the second air inlet 1301. Air flows into the second air inlet 1301, passes the second heat dissipating channel 7b, and finally flows out from the spaces between the fins 11 to bring out heat radiated from the fins 11 to air thereraround and enhance heat dissipation of the fins 11. By both the first and second heat dissipating channels 7a, 7b, efficiency of natural convection can be increased. This reduces required area of heat dissipation of the heat sink 1 so as to make the ratio of power of the LED lamp to heat dissipating area of the heat sink 1 be between 20 and 30. In this embodiment, overall weight of the LED lamp is less than 1.7 Kg. When the LED lamp is provided with power of about 200 W (below 300 W, preferably, below 250 W), the LED chips 311 are lit up and emit luminous flux of at least 25000 lumens.

As shown in FIG. 1, weight of the heat sink 1 in this embodiment accounts for above 50% of weight of the LED lamp. In some embodiments, weight of the heat sink 1 accounts for 55~65% of weight of the LED lamp. Under this condition, volume of the heat sink 1 accounts for above 20% of volume of the overall LED lamp. Under a condition of the same thermal conductivity of the heat sink 1 (i.e. overall heat sink 1 uses a single material or two different materials with almost identical thermal conductivity), the larger the volume occupied by the heat sink 1 is, the larger the heat dissipating area which can be provided by the heat sink 1 is. As a result, when volume of the heat sink 1 accounts for above 20% of volume of the overall LED lamp, the heat sink 1 may have more usable space to increase its heat dissipating area. Considering the arrangement space of the power source 5, the lamp cover 4 and the lamp shell 2, preferably, volume of the heat sink 1 accounts for 20%~60% of volume of the overall LED lamp. More preferably, volume of the heat sink 1 accounts for above 25~50% of volume of the overall LED lamp. Accordingly, although the overall size of the LED lamp is limited and the space for receiving the power source 5, the lamp cover 4 and the lamp shell 2 must be kept, volume of the heat sink 1 can still be maximized. This is advantageous to design of overall heat dissipation of the LED lamp.

Figure 13:
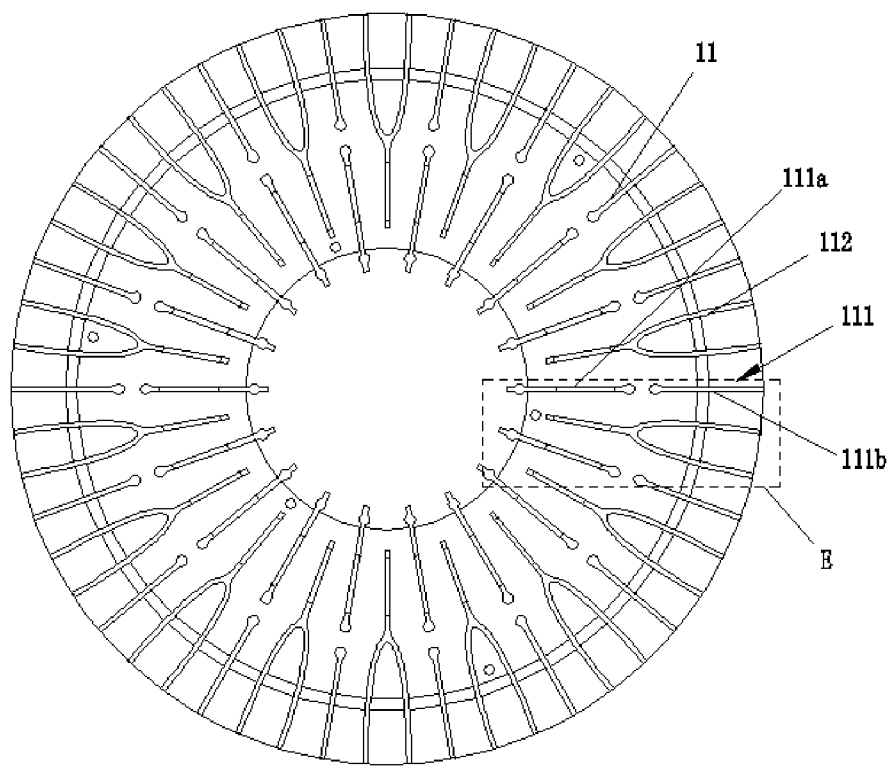
FIG. 13 is a top view of the heat sink of the LED lamp of FIG. 11.

FIG. 13 is top view of the heat sink 1 of the LED lamp of the embodiment. As shown, the heat sink 1 suffers the above volume limit, so at least part of the fins 11 are extended outward in a radial direction of the LED lamp with at least two sheets at an interval. By such an arrangement, the fins 11 in a fixed space can have larger area of heat dissipation. Besides, the extended sheets forms support to the fins 11 to make the fins firmly supported on the base 13 to prevent the fins 11 from deflecting.

In detail, as shown in FIG. 13, the fins includes first fins 111 and second fins 112. The bottoms of both the first fins 111 and the second fins 112 in an axis of the LED lamp connect to the base 13. The first fins 111 interlace with the second fins 112 at regular intervals. Being projected from the axial direction of the LED lamp, each of the second fins 112 is of a Y-shape. Such Y-shaped second fins 112 can have more heat dissipating area under a condition of the heat sink 1 occupying the same volume. In this embodiment, both the first fins 111 and the second fins are evenly distributed on a circumference, respectively. Every adjacent two of the second fins 112 are symmetrical about one of the first fins 111. In this embodiment, an interval between one of the first fins 111 and adjacent one of the second fins 112 is 8~12 mm. In general, to make air flow in the heat sink 1 smooth and to make the heat sink perform a maximum effect of heat dissipation, intervals between the fins 11 should be as uniform as possible.

Figure 17:
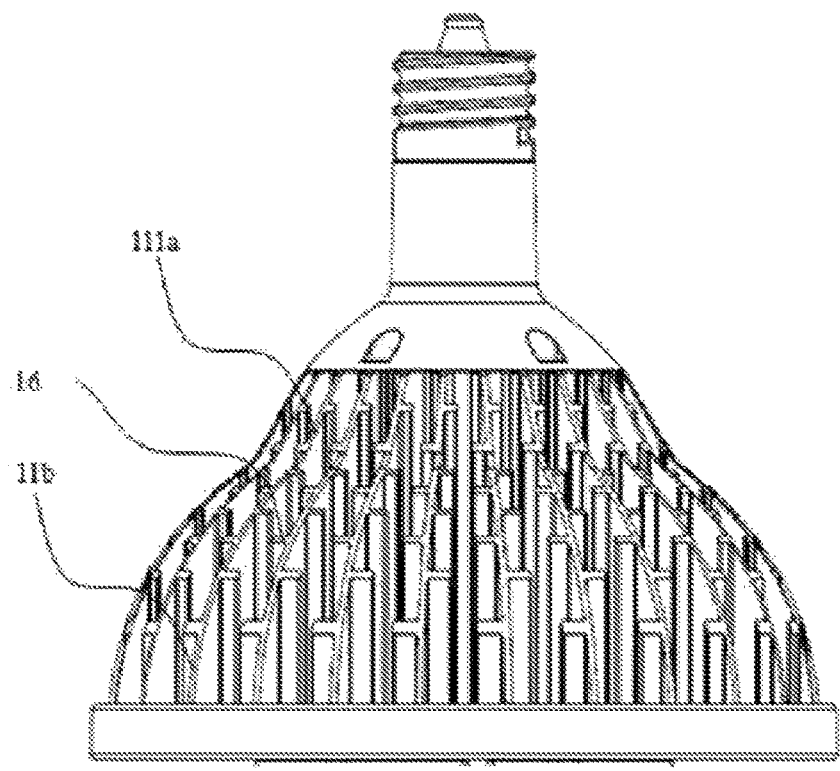
FIG. 17 is a main view of an LED lamp of another embodiment.

FIG. 17 is a main view of an LED lamp of another embodiment. As shown, two side of each fin 11 is provided with heat dissipating bars 16. Each of the heat dissipating bar 16 on a side is located between adjacent two of the heat dissipating bars on the other side. That is, the heat dissipating bars 16 on two opposite sides do not superpose each other in a projective direction. In this embodiment, a distance between every two of the heat dissipating bars on a side is the same as a distance between every two of the heat dissipating bars on the other side. Such heat dissipating bars 16 can increase overall surface area of the fins 11 to make the fins 11 have more heat dissipating area for heat dissipation for improving performance of heat dissipation of the heat sink 1. In this embodiment, to increase surface area of the fins 11, surfaces of the fins 11 may be configured to be of a waved shape.

Figure 14:
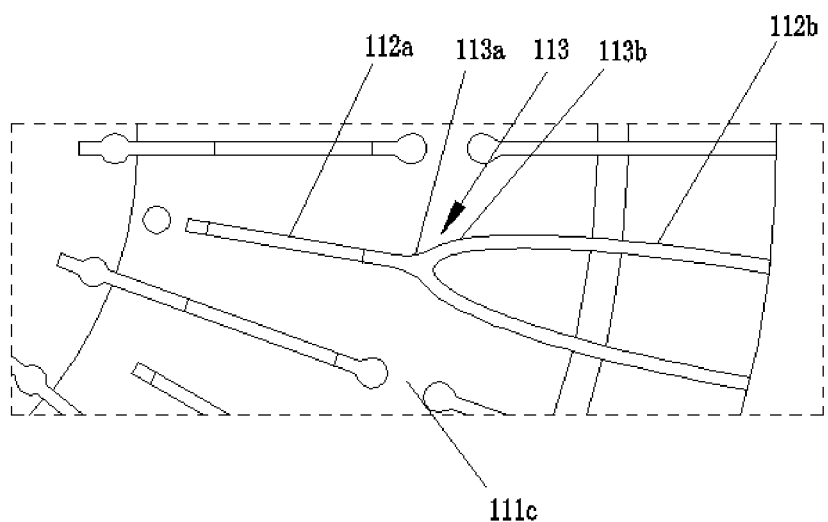
FIG. 14 is an enlarged view of portion E in FIG. 13.
Figure 15:
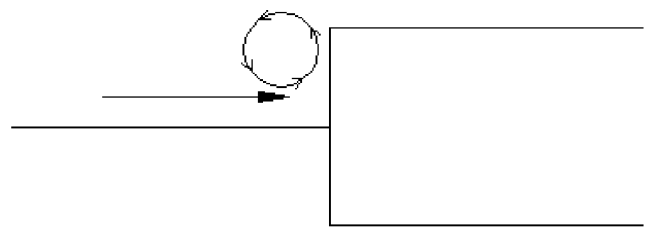
FIG. 15 is a schematic view showing a vortex formed by air near the second fins according to another embodiment of the present invention.

As shown in FIG. 13, at least one of the fins 11 is divided into two portions in a radial direction of the LED lamp. Thus, a gap between the two portions forms a passage to allow air to pass. In addition, the projecting area of the gap directly exactly corresponds to an area that the LED chips 311 are positioned on the LED board 3 to enhance convection and improve an effect of heat dissipation to the LED chips 311. In an aspect of limited overall weight of the LED lamp, part of the fins 11 divided with a gap reduces the amount of the fins 11, decreases overall weight of the heat sink 1, and provides a surplus space to accommodate other elements. In this embodiment, as shown in FIG. 14 is an enlarged view of portion E in FIG. 13. As shown in FIGS. 13 and 14, the fins 11 includes first fins 111 and second fins 112. Each of the first fins 11 is divided into two portions in a radial direction of the LED lamp, i.e. a first portion 111a and a second portion 111b. The two portions are divided with a gap portion 111c. The first portion 111a is located inside the second portion 111b in a radial direction. Each of the second fins 112 has a third portion 112a and a fourth portion 112b extending therefrom. The fourth portions 112b are located radially outside the third portions 112a to increase space utilization and make the fins have more heat dissipating are for heat dissipation. As shown in FIG. 14, the third portion 112a is connected to the fourth portion 112b through a transition portion 113. The transition portion 113 has a buffer section 113a and a guide section 113b. At least one of both of the buffer section 113a and the guide section 113b are arced in shape. In other embodiment, both the buffer section 113a and the guide section 113b are formed into an S-shape or an inverted S-shape. The buffer section 113a is configured to prevent air radially outward flowing along the second fins 112 from being obstructed to cause vortexes. Instead, the guide section 113b is configured to be able to guide convection air to radially outward flow along the second fins 112 without interference (as shown id FIG. 15).

As shown in FIG. 14, one of the second fins 112 includes a third portion 112a and two fourth portions 112b. The two fourth portions 112b are symmetrical about the third portion 112a. In other embodiments, one of the second fins 112 may include a third portion 112a and multiple fourth portions 112b such as three or four fourth portions 112b (not shown). The multiple fourth portions 112b of the second fin 112 are located between two first fins 111.

As shown in FIG. 14, a direction of any tangent of the guide section 113b is separate from the gap portion 111c to prevent convection air from flowing into the gap portion 111c through the guide portion 113b, such that the poor efficiency of heat dissipation caused by longer convection paths is able to be avoid as well. Preferably, a direction of any tangent of the guide section 113b is located radially outside the gap portion 111c. In other embodiments, a direction of any tangent of the guide section 113b is located radially inside the gap portion 111c.

Figure 16:
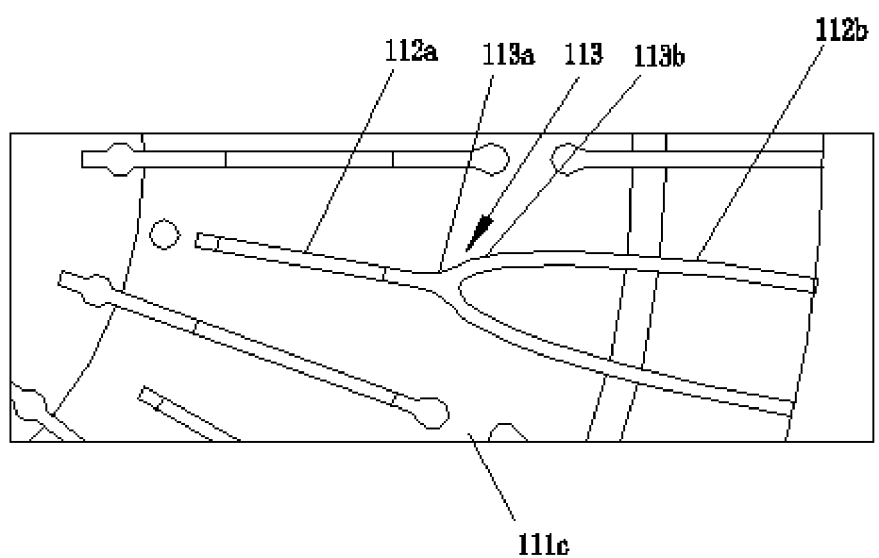
FIG. 16 is a partially schematic view of the heat sink of another embodiment.

As shown in FIG. 16, in another embodiment, a direction of any tangent of the guide section 113b falls in the gap portion 111c to make convection more sufficient but convection paths will increase.

Figure 11:
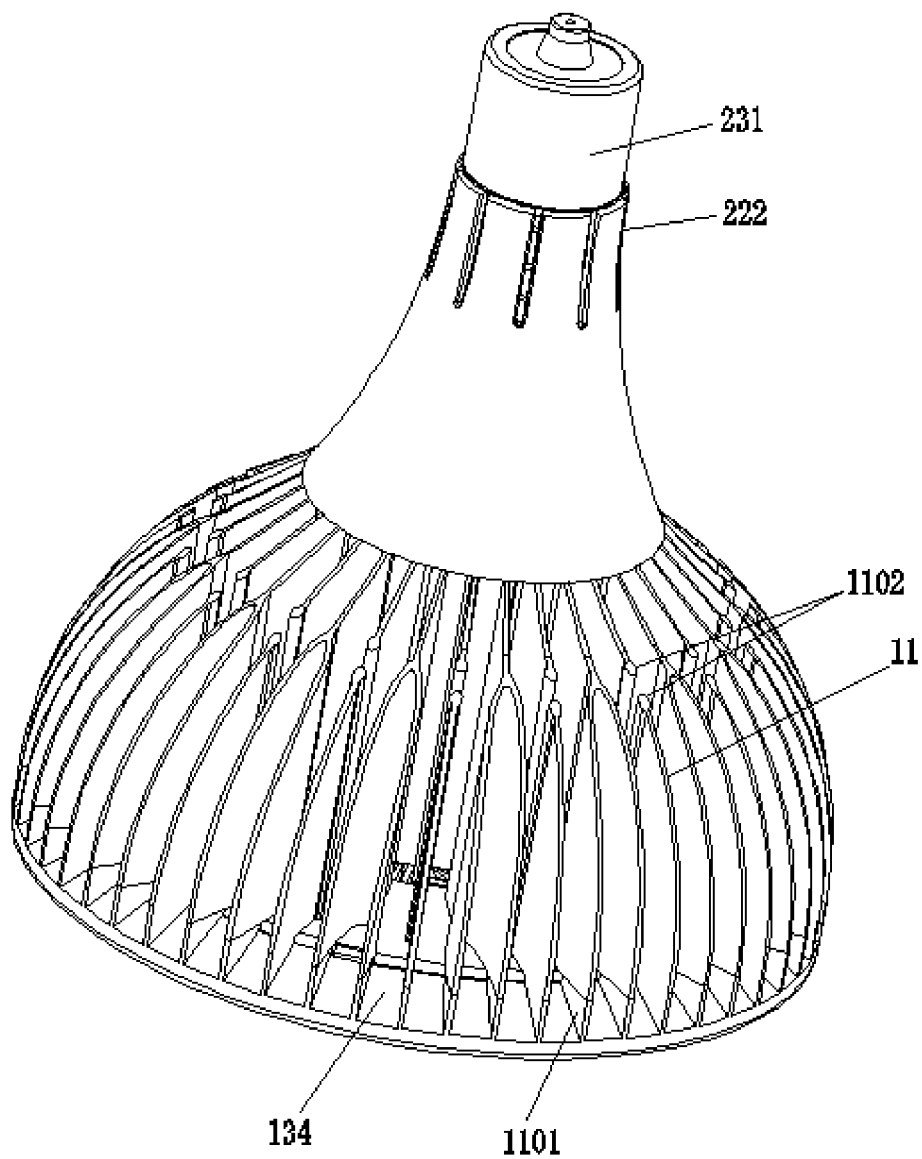
FIG. 11 is a perspective view of an LED lamp, according to another embodiment of the present invention.

As shown in FIG. 11, at least partially of fin 11 has a protrusion 1102 projecting from a surface of the fin 11. The protrusions 1102 extend along an axis of the LED lamp and are in contact with the base 13. Besides, a surface of the protrusion 1102 may selectively adopt a cylindrical shape or a regular or an irregular polygonal cylinder. The protrusions 1102 increase surface area of the fins 11 to enhance efficiency of heat dissipation. In addition, the protrusions 1102 also form a support effect to the fins 11 to prevent the fins 11 from being inflected in manufacture. In some embodiments, a single fin 11 is divided into two portions in a radial direction of the LED lamp. Each portion is provided with at least one protrusion 1102 to support the two portions. In this embodiment, the protrusion 1102 is located at an end portion of each fin 11 in a radial direction of the LED lamp, for example, at end portions of the first portions 111a, 111b (the ends near the gap portion 111c).

In some embodiments, when each fin 11 is a single piece without the gap portion, the protrusion 1102 may also be disposed on a surface of each fin 11 (not shown) to increase surface area of heat dissipation of the fins 11 and have a support effect to the fins 11 to prevent the fins 11 from being inflected in manufacture.

Figure 12:
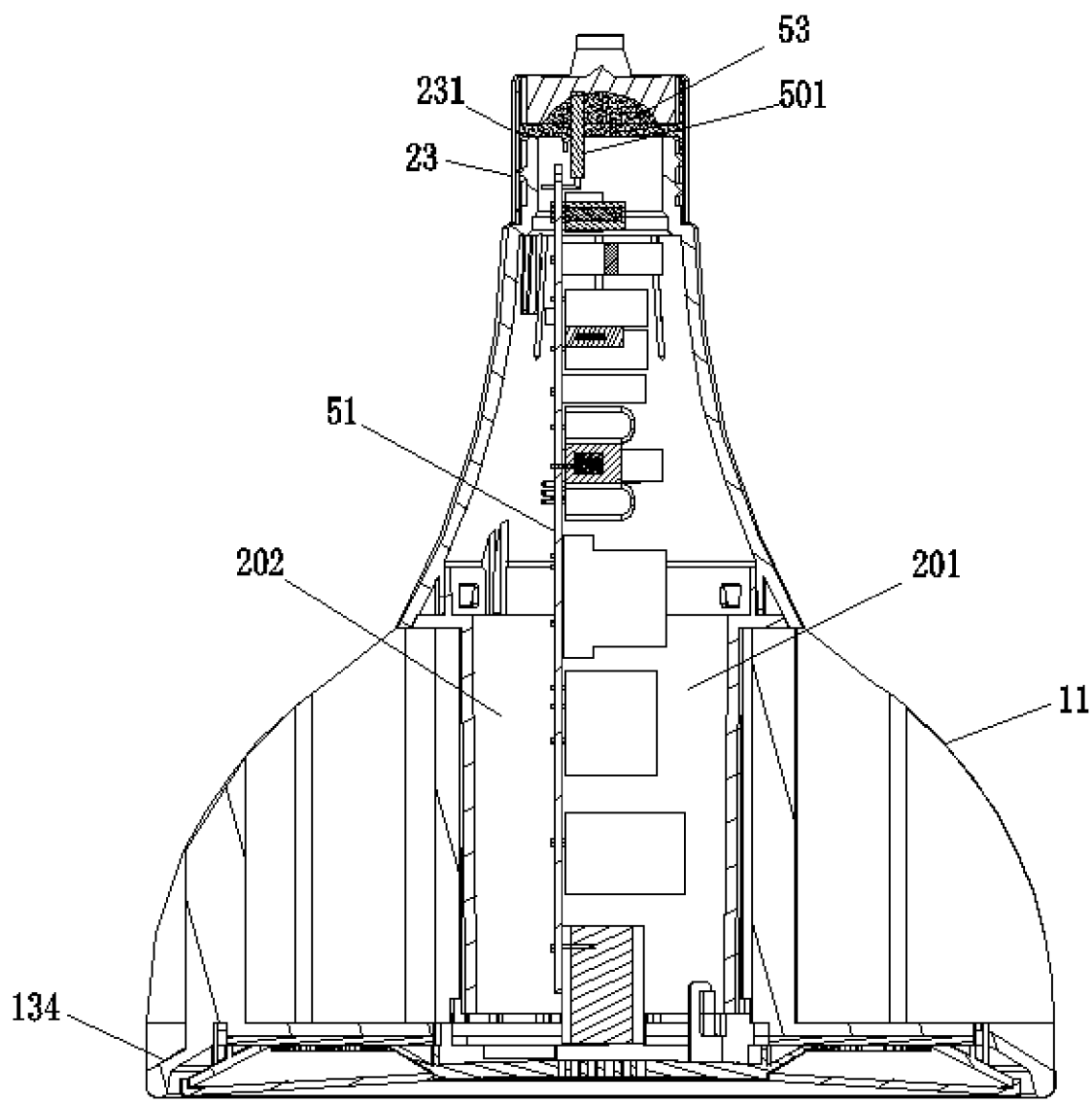
FIG. 12 is a cross-sectional view of the LED lamp of FIG. 11.

FIG. 12 is a cross-sectional view of the LED lamp of this embodiment. As shown, in this embodiment, a back side 134 of the base 13 is slanted. For example, when the LED lamp is being hung, in an inward radial direction, the back side 134 is upwardly slanted. In another aspect, in a radial direction of the LED lamp toward an axis of the LED lamp, an axial distance from the back side 134 to the light board 3 is progressively increased. Such an arrangement is advantageous to convection air is introduced along the back side 134 to bring out heat of the back side 134 and prevents the back side 134 from obstructing air flowing into.

Figure 18:
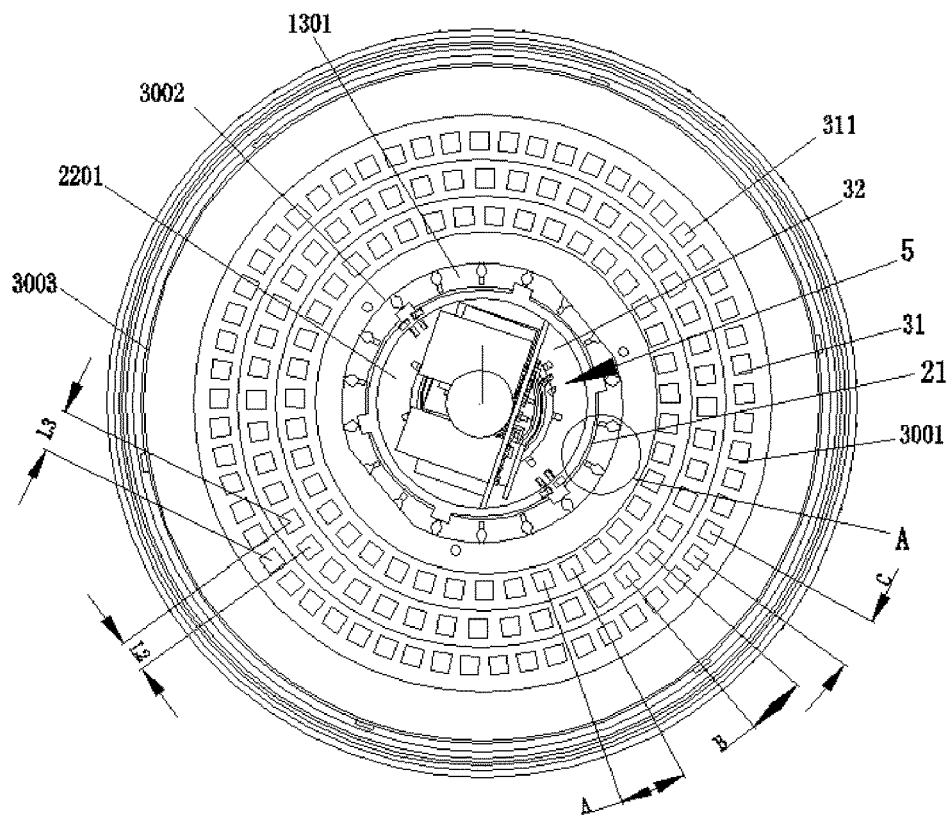
FIG. 18 is a bottom view of the LED lamp of FIG. 1 without the lamp cover.

As shown in FIGS. 1 and 18, the light board 3 has an inner border 3002 and an outer border 3003. Both the inner border 3002 and the outer border 3003 separately upward extend along the axial direction of the LED lamp to form a region. Area of part of the fins 11 inside the region is greater than area of part of the fins 11 outside the region. As a result, the most of the fins 11 can correspond to the light board 3 (a shorter heat dissipating path) to enhance heat dissipating efficiency of the fins 11 and increase effective area of heat conduction of the fins 11 to the LED chips 311.

As shown in FIGS. 3, 5 and 18, a reflecting region 3001 is disposed in a region between the inner ring and an outer edge of the light board 3 to reflect the upward light to the light output surface 43. This can reduce loss of light in an opposite direction of light output in the axial direction of the LED lamp to increase overall intensity of light output.

As shown in FIGS. 4 and 18, the light board 3 is formed with a third aperture 32 separately communicating with the first heat dissipating channel 7a and the second heat dissipating channel 7b. That is, the third aperture 32 communicates with spaces between the fins 11 and the chamber of the lamp shell 2 to form air convection paths between the spaces between the fins 11 and between the chamber of the lamp shell 2 and the outside of the Led lamp. The third aperture 32 is located inside the inner ring of the LED lamp. Thus, it would not occupy the space of the reflecting region 3001 to affect reflective efficiency. In detail, the third aperture 32 is located at a central region of the light board 3 and both the first air inlet 2201 and the second air inlet 1301 make air intake through the same aperture (the third aperture 32). In other words, after convection air passes through the third aperture 32, and then enters the first air inlet 2201 and the second air inlet 1301. The third aperture 32 is located at a central region of the light board 3, so both the first air inlet 2201 and the second air inlet 1301 can commonly use the same air intake. Thus, this can prevent from occupying excessive region of the light board 3 and prevent usable regional area of the light board 3 for disposing the LED chips 311 from decreasing due to multiple air intakes. On the other hand, the sleeve 21 corresponds to the third aperture 32, so convection air may have an effect of thermal isolation to prevent temperatures inside and outside the sleeve 21 from mutually affecting each other when air enters. In other embodiments, if both the first air inlet 2201 and the second air inlet 1301 are located at different positions, then the third aperture 32 may be multiple in number to correspond to both the first air inlet 2201 and the second air inlet 1301. The light board 3 comprises a first surface and a second surface which is opposite to the first surface, the LED chips 311 are mounted on the first surface and surrounding the third aperture 32, and the second surface is in contact with the base 13 of the heat sink 1, such that heat generated from the LED chips 311 is able to be transferred to the fins 11 through the base 13 while the LED lamp is working As shown in FIGS. 1, 2, 3 and 4, the lamp shell 2 includes the lamp head 23, the lamp neck 22 and the sleeve 21. The lamp head 23 connects to the lamp neck 22 which connects to the sleeve 21. The sleeve 21 is located in the heat sink 1 (in the axial direction of the LED lamp, all or most of the sleeve 21, for example, at least 80% of height of the sleeve 21, does not exceed the heat sink 1). The lamp neck 22 projects from the heat sink 1. Both the sleeve 21 and the lamp neck 22 can provide sufficient space to receive the power source 5 and perform heat dissipation, especially for the power source 5 of a high power LED lamp (in comparison with a low power LED lamp, a power source of a high power LED lamp has more complicated composition and larger size). The power source 5 is received in both the lamp neck 22 and lamp head 23. Total height of the lamp neck 22 and the lamp head 23 is greater than height of the heat sink 1 so as to provide more space for receiving the power source 5. The heat sink 1 is separate from both the lamp neck 22 and the lamp head 23 (not overlap in the axial direction, the sleeve 21 is received in the heat sink 1). Thus, the power source 5 in both the lamp neck 22 and the lamp head 23 is affected by the heat sink 1 slightly (heat of the heat sink 1 would not be conducted to the lamp neck 22 and the lamp head 23 along a radial direction). In addition, the configuration of height of the lamp neck 22 is advantageous to the chimney effect of the first heat dissipating channel 7a to guarantee convection efficiency of the first heat dissipating channel 7a. In other embodiments, height of the lamp neck 22 is at least 80% of height of the heat sink 1 to accomplish the above function. The sleeve 21 is made of a thermo-isolated material to prevent mutual influence of heat from the fins and the power source.

As shown in FIG. 2, the second air inlet 1301 is located in a lower portion of the heat sink 1 and radially corresponds to an inner side or the inside of the heat sink 1, i.e. the second air inlet 1301 radially corresponds to the inner side or the inside of the fins 11. The inner side or the inside of the fins 11 corresponds to an outer wall (a radially inner side of the fins 11, which nears or abuts against the sleeve 21) of the sleeve 21 of the lamp shell 2. Thus, after convection air flows into the second air inlet 1301, it flows upward along the outer wall of the sleeve 21 to perform convection and radially dissipates heat in the inner side or the inside of the fins 11 and the outer wall of the sleeve 21 to implement an effect of thermal isolation. That is, this can prevent heat of the heat sink 1 is conducted from the outer wall of the sleeve 21 to the inside of the sleeve 21 not to affect the power source 5. From the above, the second heat dissipating channel 7b can not only enhance heat dissipation of the fins 11, but also implement an effect of thermal isolation. Make a positional comparison between the second air inlet 1301 and the LED chips 311, the second air inlet 1301 is located radially inside all of the LED chips 311.

Figure 19A:
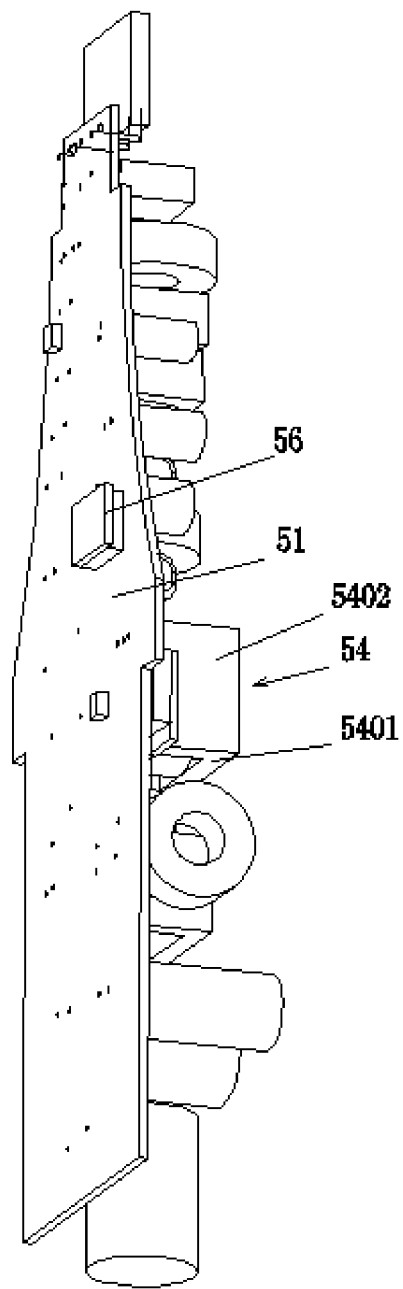
FIGS. 19A~19C are perspective views of the power source, according to some embodiments of the present invention.
Figure 19B:
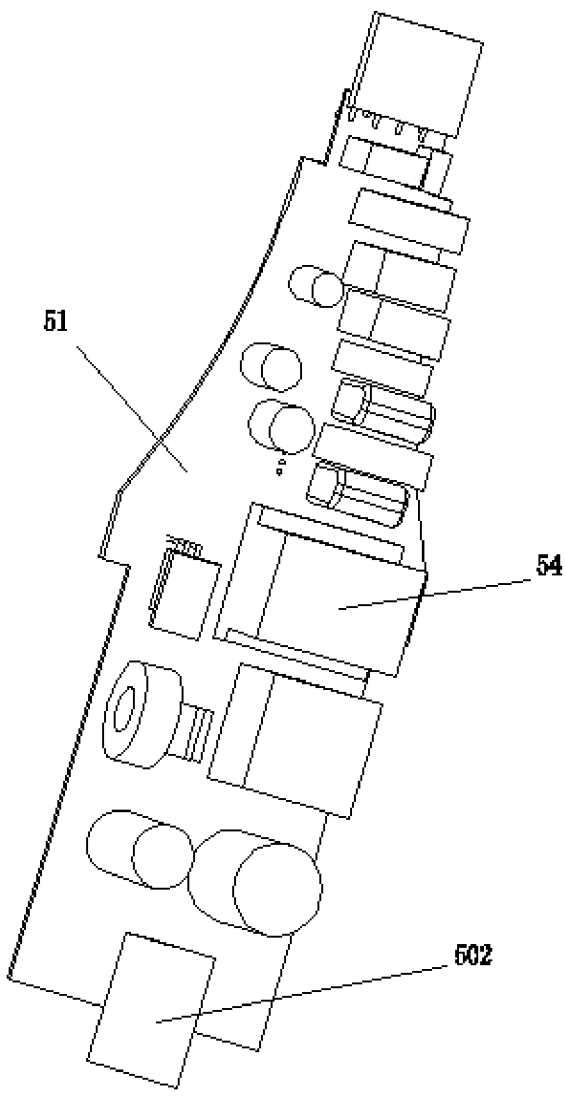
Figure 19C:
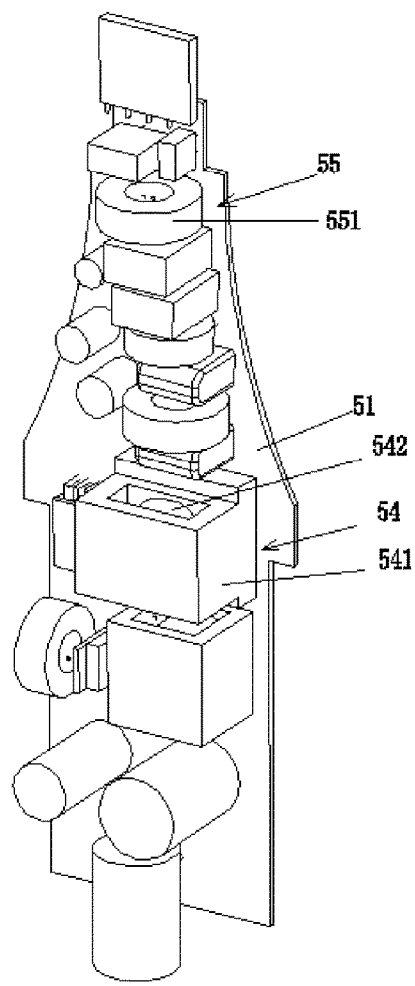

FIGS. 19A~19C are perspective views of the power source 5 of one embodiment at different viewpoints. FIG. 19d is a main view of the power source 5 of one embodiment. The power source 5 is electrically connected to the LED chips 311 to power the LED chips 311. As shown in FIGS. 19A~19C, the power source 5 includes a power board 51 and a plurality of electronic components mounted thereon.

As shown in FIGS. 20 to 28, the present disclosure provides a power supply module for LED lamp. The power supply module includes input ends (ACN, ACL) for receiving AC driving signal; a first rectifying circuit 100 for converting the AC driving signal into rectified signal; a filtering 200 for converting the rectified signal into filtered signal; a power converter 400 for converting the filtered signals into power signal which is capable of lighting up an LED light source 500; and a bias generating circuit 600 electrically connected to the input ends (ACN, ACL) and the power converter 400 for performing buck-conversion to the AC driving signal to generate a working voltage of the power converter 400.

Figure 22:
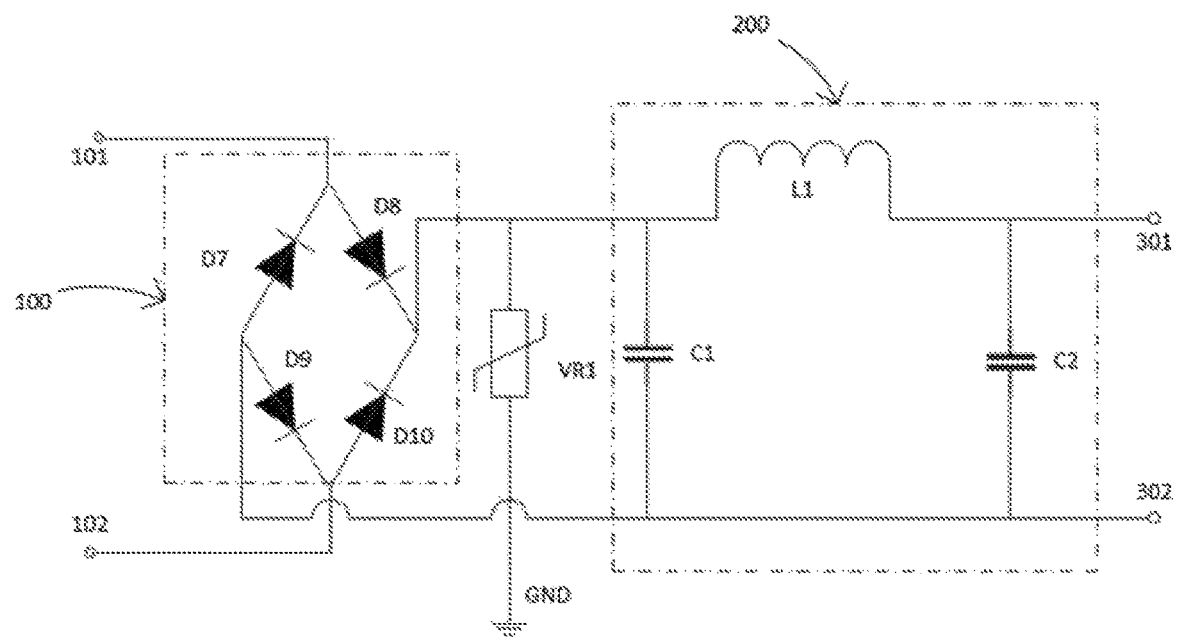
FIG. 22 is a circuit diagram of a rectifier and a filter of an embodiment of the invention.

In this embodiment, the first rectifying circuit 100 may be a bridge rectifier. As shown in FIG. 22, which is a circuit diagram of a rectifying circuit and a filtering circuit of an embodiment of the invention, the first rectifying circuit 100 includes diodes D7, D8, D9 and D10. The first rectifying circuit 100 performs full wave rectification to the AC driving signal to generate DC driving signal (DC power).

In detail, as shown in FIG. 22, anodes of diodes D7, D9 are electrically connected to a first end of the filtering circuit 200, cathodes of diodes D7, D9 are electrically connected to anodes of diodes D8, D10, and cathodes of diodes D8, D10 are electrically connected to a second end of the filtering circuit 200. Contacts of diodes D7 and D8 are electrically connected to the first end ACL. A cathode of diode D8 is electrically connected to a cathode of diode D10. Contacts of diodes D9 and D10 are electrically connected to the second end ACN.

In this embodiment, the filtering circuit 200 includes capacitors C1, C2 and an inductor L1. First ends of both capacitor C1 and inductor L1 serve as the second end of the filtering circuit 200 to electrically connect with cathodes of diodes D8 and D10. The second end of inductor L1 is electrically connected to the first end of capacitor C1. The second ends of capacitors C1 and C2 serve as the first end of the filtering circuit 200 to electrically connect with anodes of diodes D7 and D9. The filtering circuit 200 receives the DC power (the rectified signal) rectified by the first rectifying circuit 100 and filters high frequency components of the DC power. The DC power filtered by the filtering circuit 200 is a relatively flat DC waveform. The filtered signal is sent to a post-stage circuit through connecting ends 301 and 302.

An electro-magnetic interference (EMI) reduction circuit 900 may be disposed between the input ends (ACN, ACL) and the rectifying circuit 100. The EMI reduction circuit 900 can reduce influence to the driving signal from an interference magnetic field. In the EMI reduction circuit 900, a power line (including a main line and/or a branch of the main line) electrically connected to two ends of the input ends ACN, ACL is electrically connected with an excitation coil LF2 connecting a resistor branch (e.g. a branch at which resistor R1 is located) and capacitor branches (e.g. branches at which capacitors CX1, CX2, CX3 are located), and separately electrically connecting inductor Li1, Li2 at two branches.

In this embodiment, the power converter 400 converts the filtered signal into an electrical signal which is capable of lighting up the LED light source 500. The power converter 400 may change voltage level of the filtered signal to generate DC driving signal with target voltage value. The power converter 400 has an output end for outputting DC driving signal with target voltage values.

Figure 20:
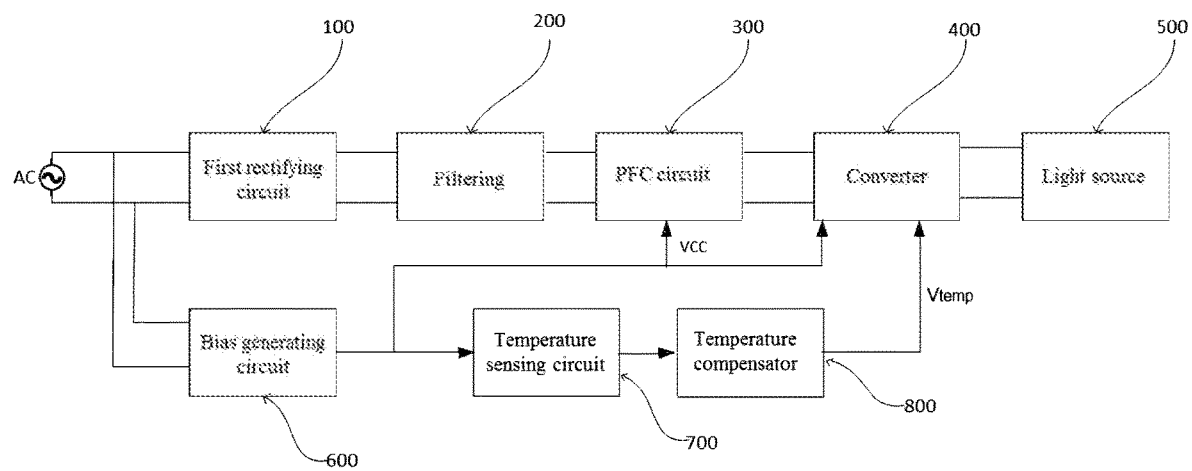
FIG. 20 is a block diagram of the power module of an embodiment of the invention.
Figure 24:
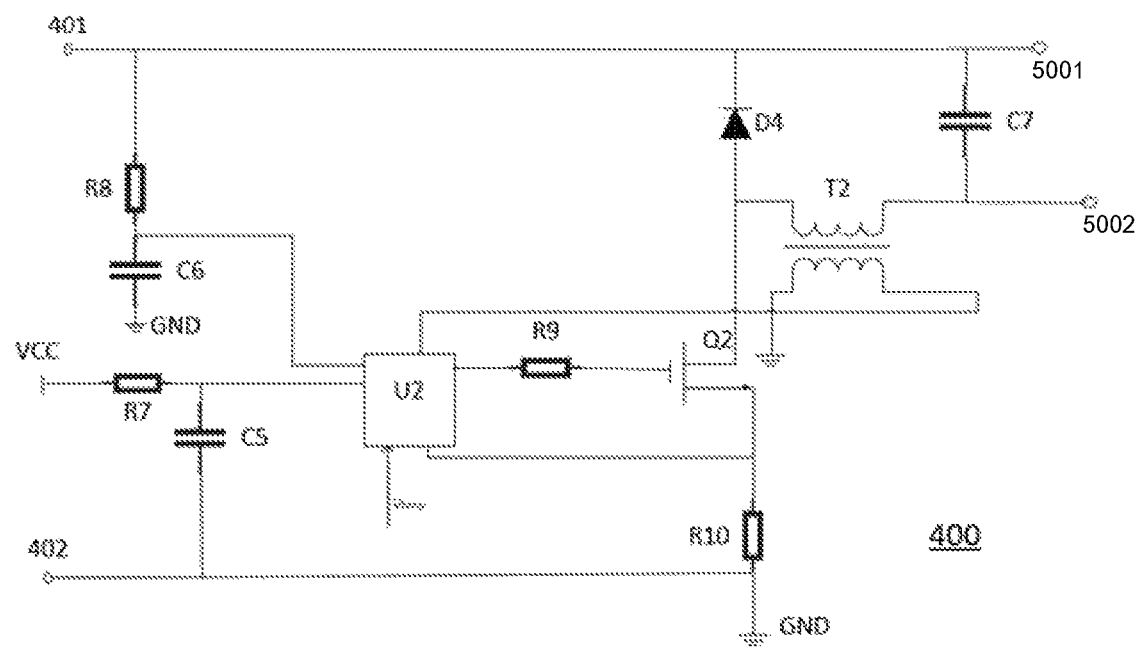
FIG. 24 is a circuit diagram of a power converter of an embodiment of the invention.

FIG. 24 is a circuit diagram of a power converter of an embodiment of the invention. As shown in FIGS. 20 and 24, the power converter 400 receives signal from a pre-stage circuit through the connecting end 401, 402, and the power signal are provided to a post-stage through the connecting ends 5001, 5002. The power converter 400 may adopt a PWM (Pulse Width Modulation) circuit, which controls pulse width to output target signal. In detail, the power converter 400 includes a controller U2, a power switch Q2, a transformer T2 and a diode D10. Controller U2, power switch Q2, diode D10 and an energy storage coil (a coil of the transformer T2, which is electrically connected between the power switch Q2 and the connecting end 5002) cooperate to output power signal (DC driving signal) with required voltage and/or current. The controller U2 is activated by a working voltage VCC provided by the bias generating circuit 600 to output PWM control signal to control switching of the power switch Q2, so that the energy storage coil repeatedly charge and discharge in response to the switching state of power switch and the continuity of the current can be maintained through diode D4 (which is operated as a flyback diode), and thus generate the required power signal between the connecting ends 5001, 5002.

Power switch Q2 may be a MOSFET. A first end (power end) of controller U2 electrically connects to an output end of the bias generating circuit 600. A second end of controller U2 electrically connects to an end of transformer T2. An end of the energy storage coil of transformer T2 electrically connects to a negative end (i.e. connecting end 5002) of the DC output ends and the other end thereof electrically connects to an anode of diode D4. An anode of diode D4 electrically connects to a positive end (i.e. the connecting end 5001) of the DC output ends. An end of the induction coil of transformer T2 electrically connects to a second end of controller U2 and the other end of the induction coil is grounded. A third end of controller U2 electrically connects to a control end of power switch Q2 through resistor R9. A first end of power switch Q2 electrically connects to a connecting point between diode D4 and transformer T2, and a second end of power switch Q2 connects to a fourth end of controller U2. Power converter 400 may be further provided with a sampling circuit to sample its working status and serve as a reference of output signal of the controller U2.

For example, the sampling circuit includes resistors R8, R10, capacitor C6 and an induction coil of the transformer T2. The controller U2 may sample voltage of the main line from resistor R8 and capacitor C6 through its first end, sample output current from the induction coil through its second end and sample current flowing through the power switch Q2 from an end of resistor R10 through its fourth end. Configuration of the sampling circuit is related to the control manner of the controller U2, the invention is not limited to this embodiment.

In this embodiment, at least one end of the switch controller U3 electrically connects to a branch at which inductor L2 is located. A filtering element and/or current stabilizer may be added between the switch controller and the inductor. The present invention is not limited thereto.

To reduce both influence resulting from harmonic to circuit properties and conversion loss, a power factor correction (PFC) circuit 300 may be disposed between the power converter 400 and filtering circuit 200. The PFC circuit 300 can increase power factors of the filtered signal by adjusting signal properties (e.g. phase, level or frequency) of the filtered signal. PFC circuit 300 electrically connects to an output end of bias generating circuit 600. In detail, PFC circuit 300 may be an active PFC circuit.

Figure 23:
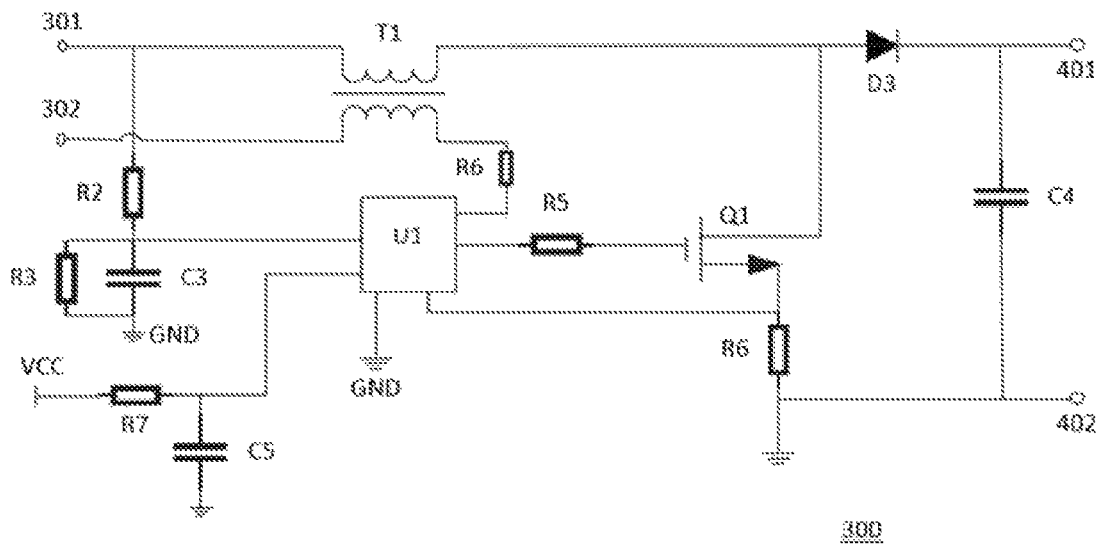
FIG. 23 is a circuit diagram of a PFC of an embodiment of the invention.

FIG. 23 is a circuit diagram of a PFC circuit of an embodiment of the invention. As shown in FIG. 23, PFC circuit 300 receives signal from the filtering circuit 300 through the connecting ends 301, 302 and sends corrected signal to the post-stage power converter 400 through connecting ends 401, 402. PFC circuit 300 includes a controller U1, a power switch Q1 electrically connected to controller U1, a transformer T1 and a diode D3. Power switch Q1 may be a MOSFET. A first end (power end) of the controller U1 electrically connects to an output end 607 of bias generating circuit 600. A second end of controller U1 electrically connects to an end of transformer T1. A coil of transformer T1 electrically connects to a main branch in series. The other end of the coil electrically connected to a second end of controller U1 is grounded. A positive end (also called connecting end 5001) of the DC output ends electrically connects to the main branch. Diode D3 is electrically connected in the branch in series. An anode of diode D3 electrically connects to both an end of transformer T1 and the filtering circuit 200, and a cathode thereof electrically connects to connecting end 401 for electrically connecting to both power converter 400 and connecting end 5001. A third end of controller U1 electrically connects to power switch Q1. An end of power switch Q1 electrically connects to a fifth electrically connecting point between diode D3 and transformer T1. Controller U1 may further electrically connects to a sampling circuit (a connecting point between resistor R2 and capacitor C3 electrically connects to the controller U1, and capacitor C3 electrically connects to resistor R3 in parallel) and other circuits as shown in FIG. 23.

It should be noted that, the PFC circuit may have various implementary manners or circuit configurations, all which can be applied to the invention, so they would not be described here.

Figure 21:
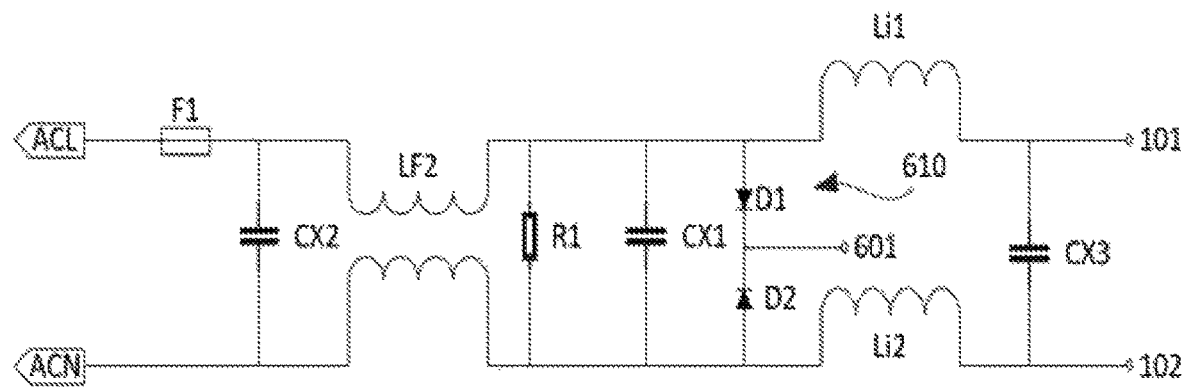
FIG. 21 is a circuit diagram of an EMI reduction circuit of an embodiment of the invention.

FIG. 25 is circuit diagram of a bias generating circuit of the first embodiment of the invention. As shown in FIGS. 21 and 25, bias generating circuit 600a may include an electricity obtainer 610, a switch controller U3 and an energy storage flyback unit 630. Electricity obtainer 610 electrically connects to both the input ends (ACN, ACL) and switch controller U3. Switch controller U3 electrically connects to energy storage unit 630 having an output end 607 for outputting a working voltage (VCC). Output end 607 electrically connects to power converter 400 to provide the working voltage (VCC) to the power converter 400.

Switch controller U3 controls switching frequency of the energy storage unit 630 according to an electricity obtaining signal from the electricity obtainer 610 to generate the working voltage of the power converter 400 and uses the output end 607 to output the working voltage to the power converter 400. The switch controller U3 is activated by responding to the electricity obtaining signal from the electricity obtainer 610 and repeatedly switches on and off to periodically charge and discharge by controlling conducting time of the energy storage unit 630. And diode D5 is used to keep flyback. Thus, the working voltage of the power converter 400 is formed and is output to the power converter 400 through the output end 607.

In an embodiment, the electricity obtainer 610 can convert AC driving signal into DC electricity obtaining signal which are equal to the AC driving signal. As shown in FIGS. 21 and 25, electricity obtainer 610 can be implemented by a second rectifying circuit (hereinafter "second rectifying circuit 610"). Second rectifying circuit 610 includes a first diode D1 and a second diode D2, which are electrically connected in series with opposite polarity (i.e. cathodes of diodes D1 and D2 are electrically connected together). Second rectifying circuit 610 has an electricity obtaining end 601 between diodes D1 and D2. The electricity obtaining end 601 electrically connects to the switch controller U3. By the opposite polarity, the two diodes D1 and D2 rectify the AC driving signal to output DC driving signal at the electricity obtaining end 601.

In detail, the electricity obtaining end 601 further electrically connects to an end of first capacitor C9, and the other end thereof electrically connects to the ground end GND. Switch controller U3 electrically connects to an end of inductor L2, and the other end thereof connects to the output end 607. Inductor L2 can perform both energy storage and release and maintain the current continuity when switch controller U3 is switching.

In this embodiment, energy storage flyback unit 630 may include an inductor L2, a third diode D5 and a second capacitor C11. A cathode of the third diode D5 connects to a connecting end 603 disposed between the switch controller U3 and inductor L2. An anode of third diode D5 connects to ground end GND. An end of second capacitor C11 electrically connects to a second connecting end 604 disposed between inductor L2 and the output end 607. The other end of second capacitor C11 electrically connects to the ground end GND. an end of a load resistor electrically connects to a third connecting end (not shown in FIG. 21) disposed between the second connecting end 604 and the output end 607. The other end of the load resistor electrically connects to ground end GND.

Further, switch controller U3 may be a MOSFET switch or an IC ship integrated with a MOSFET switch. Of course, in some embodiments, switch controller U3 may be a BJT switch. Switch controller U3 has multiple connecting ends (also called connecting port). An electricity obtaining branch is formed between the electricity obtaining end 601 and the ground end GND. The first capacitor C9 is connected in the electricity obtaining branch in series. At least one connecting end of switch controller U3 electrically connects to the electricity obtaining end 601 through the electricity obtaining branch. A branch at which both the electricity obtaining branch and capacitor C9 are located electrically connects to the electricity obtaining end 601 through the fourth connecting end 602. The ground end GND electrically connects to a grounding line 640. All of the third diode D5, the second capacitor C11 and the load resistor electrically connect to the grounding line 640.

The bias generating circuit 600 may be further provided with a sampling circuit to sample its working status and to be a reference of output signal of the switch controller. In addition, in the practical application, switch controller U3 may be a chip or IC integrated with at least a control circuit and a power switch, but the present invention is not limited thereto.

For example, the sampling circuit may include a first sampling circuit 650 and a second sampling circuit 620. First sampling circuit 650 electrically connects to both the electricity obtaining end 601 (forming a connecting point 605 in FIG. 25) and switch controller U3. The second sampling circuit 620 electrically connects to both the output end 607 and switch controller U3. Switch controller U3 outputs a stable working voltage according to sampling signal from both the first sampling circuit 650 and second sampling circuit 620. Configuration of the sampling circuit is related to the control manner of switch controller U3, the invention is not limited to this. FIG. 25 is circuit diagram of the bias generating circuit of the first embodiment of the invention.

In other embodiments, the bias generating circuit may also be used for providing a working voltage to a temperature sensing circuit 700. FIG. 26 is circuit diagram of the bias generating circuit of the second embodiment of the invention. FIG. 27 is circuit diagram of a temperature sensing circuit of an embodiment of the invention. As shown in FIGS. 26 and 27, the temperature sensing circuit 700 electrically connects to power converter 400 for sending temperature detecting signal to power converter 400. The temperature sensing circuit 700 has a temperature sensor electrically connecting to bias generating circuit 600b to make bias generating circuit 600b provide a working voltage to temperature sensing circuit 600b.

In this embodiment, in comparison with the embodiment shown in FIG. 25, the bias generating circuit 600b of this embodiment further includes a transistor Q3, a diode D6, a resistor R12 and a capacitor C10. Transistor Q3 may be a BJT as an example (hereinafter refer as BJT Q3). The temperature detector 700 electrically connects to BJT Q3 of the bias generating circuit 600b. The collector of BJT Q3 electrically connects to output end 607. The base of BJT Q3 electrically connects to the grounding line with the ground end GND.

The temperature sensing circuit 700 is activated by responding to the working voltage provided by the bias generating circuit 600b through the connecting ends 701 and 702 and feeds temperature data (Vtemp) back to the controller U2 of the power converter 400. When a temperature exceeds a threshold value (indicating a situation of overheating), the controller U2 of the power converter 400 would reduce output power to decrease temperature and guarantee the safety during operation.

Moreover, as shown in FIG. 28, the temperature sensing circuit 700 further electrically connects to a temperature compensator 800. FIG. 28 is circuit diagram of a temperature compensator of an embodiment of the invention. Temperature sensing circuit 700 electrically connects between temperature compensator 800 and bias generating circuit 600b. Temperature compensator 800 electrically connects to power converter 400.

Temperature compensator 800 makes a reference temperature of a free end of the temperature sensing circuit more reasonable. The temperature compensator 800 in this embodiment can be implemented by a comparator CP (but not limited to this). An input end of comparator CP receives a voltage, indicating a temperature information, through connecting end 801 and compares the voltage indicating the temperature information with a reference voltage Vref of another input end of comparator CP, such that whether the temperature sensed by the temperature sensing circuit 700 exceeds a threshold value can be determined and a temperature sensing result signal Vtemp indicating whether the sensed temperature exceeds a threshold value is generated at an output end of the comparator CP. The output end of the temperature compensator 800 electrically connects to the controller U2 of the power converter 400 to make the temperature sensing result signal Vtemp fed back to controller U2 of power converter 400, so that controller U2 can adjust the output power depending on the system environment temperature.

In detail, a circuit diagram of the temperature compensator 800 may be as shown in FIG. 28. It should be noted that, the temperature compensator 800 can be implemented by various manners. The invention is not limited to the circuit shown in FIG. 28.

The above depiction has been described with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

What is claimed is:

1. An LED (light emitting diode) lamp comprising:
   a lamp shell;
   a passive heat dissipating element having a heat sink connected to the lamp shell, wherein the heat sink comprises fins and a base;
   a power source disposed in the lamp shell;
   a light emitting element connected to the base of the heat sink of the passive heat dissipating element and comprising LED chips electrically connected to the power source;
   a first channel defined in a chamber of the lamp shell for dissipating heat generated from the power source while the LED lamp is working; and
   a second channel defined in the heat sink and between the fins and the base for dissipating the heat of the heat sink, which is generated from the LED chips and transferred to the heat sink;
   wherein the first channel comprises a first end on the light emitting element to allow air flowing from outside of the LED lamp into the chamber, and a second end on the upper portion of the lamp shell to allow air flowing from inside of the chamber out to the LED lamp;
   wherein the second channel comprises a third end on the light emitting element to allow air flowing from outside of the LED lamp into the second channel, and flowing out from spaces between every adjacent two of the fins;
   wherein the light emitting element further comprises an aperture communicating simultaneously with both the first channel and the second channel by connecting with the first end of the first channel and the third end of the second channel.

2. The LED lamp of claim 1, wherein the aperture is located in a central region of the light emitting element, and the aperture forms an air intake of both the first channel and the second channel.

3. The LED lamp of claim 2, wherein the light emitting element comprises a first surface and a second surface which is opposite to the first surface, the LED chips are mounted on the first surface and surrounding the aperture, and the second surface is in contact with the base of the heat sink, such that heat generated from the LED chips is able to be transferred to the fins through the base while the LED lamp is working.

4. The LED lamp of claim 1, wherein the heat sink comprises first fins and second fins, bottoms of both the first fins and the second fins in an axis of the LED lamp connect to the base, the first fins interlace with the second fins at regular intervals, and one of the second fins includes a third portion and two fourth portions, the two fourth portions are symmetrical about the third portion.

5. The LED lamp of claim 1, wherein the lamp shell including a lamp head, a lamp neck and a sleeve, the lamp head connects to the lamp neck which connects to the sleeve.

6. The LED lamp of claim 5, wherein the power source having a first portion and a second portion, the first portion of the power source is disposed in both the lamp neck and the lamp head of the lamp shell, and the second portion of the power source is disposed in the heat sink of the passive heat dissipating element.

7. The LED lamp of claim 1, further comprising a lamp cover with a light output surface and an end surface, wherein the end surface is formed with a vent to let air flowing from outside of the LED lamp into both the first channel and the second channel through the vent.

8. The LED lamp of claim 7, where the first end is projected onto the end surface in an axis of the LED lamp to occupy an area on the end surface, which is defined as a first portion, another area on the end surface is defined as a second portion, and the vent in the first portion is greater than the vent in the second portion in area.

9. The LED lamp of claim 1, wherein a ratio of power of the LED lamp to heat dissipating area of the heat sink is 1:20~30.

10. The LED lamp of claim 9, wherein the ratio of power of the LED lamp to heat dissipating area of the heat sink is 1:22~26.

11. The LED lamp of claim 10, wherein the ratio of power of the LED lamp to heat dissipating area of the heat sink is 1:25.

12. The LED lamp of claim 1, wherein a volume of the heat sink accounts for 20%~60% of an overall volume of the LED lamp.

13. The LED lamp of claim 12, wherein the volume of the heat sink accounts for 25%~50% of an overall volume of the LED lamp.

14. The LED lamp of claim 1, wherein overall weight of the LED lamp is less than 1.7 Kg, When the LED lamp is provided with power of 200 W, the LED chips are lit up and emit luminous flux of at least 25000 lumens.

15. The LED lamp of claim 7, further comprising an inner reflecting surface disposed inside the light output surface of the lamp cover and an outer reflecting surface disposed in the outer circle of the array of the LED chips, wherein the inner reflecting surface is configured to reflect part of light emitted from the inmost of the array of LED chips, the outer reflecting surface is configured to reflect part of light emitted from the outermost of the array of LED chips.

16. The LED lamp of claim 15, wherein total luminous flux of the light reflected by both the inner reflecting surface and the outer reflecting surface and emitted through the light output surface is at least 1500 lm.

17. The LED lamp of claim 5, wherein the sleeve of the lamp shell is located in the heat sink, the lamp neck projects from the heat sink, height of the lamp neck is at least 80% of height of the heat sink.

18. The LED lamp of claim 4, wherein each of the first fins is divided into two portions in a radial direction of the LED lamp, the two portions are divided with a gap portion, the third portion is connected to the fourth portion through a transition portion, the transition portion has a buffer section and a guide section, a direction of any tangent of the guide section is separate from the gap portion.

19. The LED lamp of claim 15, wherein in the projected area of the LED lamp, there is a light concentrating area within the projected area, and luminous flux of the light projected by the LED lamp onto the light concentrated area accounts for 35%~50% of the total luminous flux.

20. The LED lamp of claim 1, wherein at least partially of fin has a protrusion projecting from a surface of the fin, the protrusions extend along an axis of the LED lamp and are in contact with the base.

* * * * *